US009356449B2

(12) United States Patent
Nishiyama et al.

(10) Patent No.: US 9,356,449 B2
(45) Date of Patent: May 31, 2016

(54) WIRELESS POWER RECEIVER, WIRELESS POWER TRANSMISSION SYSTEM, AND POWER CONTROLLER

(75) Inventors: Tetsuya Nishiyama, Tokyo (JP); Yoshihiro Saitoh, Tokyo (JP)

(73) Assignee: TDK CORPORATION, Tokyo (JP)

( * ) Notice: Subject to any disclaimer, the term of this patent is extended or adjusted under 35 U.S.C. 154(b) by 886 days.

(21) Appl. No.: 13/270,048

(22) Filed: Oct. 10, 2011

(65) Prior Publication Data

US 2012/0223587 A1 Sep. 6, 2012

Related U.S. Application Data

(60) Provisional application No. 61/447,863, filed on Mar. 1, 2011, provisional application No. 61/447,854, filed on Mar. 1, 2011.

(51) Int. Cl.
*H01F 27/42* (2006.01)
*H02J 5/00* (2016.01)
*H03H 7/40* (2006.01)

(52) U.S. Cl.
CPC . *H02J 5/005* (2013.01); *H03H 7/40* (2013.01)

(58) Field of Classification Search
USPC ........................................................ 307/104
See application file for complete search history.

(56) References Cited

U.S. PATENT DOCUMENTS

| 2007/0222542 A1 | 9/2007 | Joannopoulos et al. |
| 2009/0127937 A1 | 5/2009 | Widmer et al. |
| 2009/0134712 A1 | 5/2009 | Cook et al. |
| 2009/0195333 A1 | 8/2009 | Joannopoulos et al. |
| 2009/0224609 A1 | 9/2009 | Cook et al. |
| 2009/0243397 A1 | 10/2009 | Cook et al. |
| 2009/0284220 A1 | 11/2009 | Toncich et al. |
| 2010/0045114 A1 | 2/2010 | Sample et al. |
| 2010/0117455 A1 | 5/2010 | Joannopoulos et al. |
| 2010/0217553 A1 | 8/2010 | Von Novak et al. |
| 2010/0327661 A1 | 12/2010 | Karalis et al. |
| 2011/0227421 A1 | 9/2011 | Sakoda et al. |

FOREIGN PATENT DOCUMENTS

| JP | 2001-238372 |   | 8/2001 |
| JP | 2002-078247 | A | 3/2002 |
| JP | 2009-206857 | A | 9/2009 |
| JP | 2010-130878 | A | 6/2010 |
| JP | 2010-141977 | A | 6/2010 |
| JP | 2010-158151 | A | 7/2010 |
| JP | 2010-233442 | A | 10/2010 |

*Primary Examiner* — Rexford Barnie
*Assistant Examiner* — Dru Parries
(74) *Attorney, Agent, or Firm* — McDermott Will & Emery LLP

(57) ABSTRACT

A wireless power receiver receives, at a receiving coil, AC power fed from a feeding coil by wireless using a magnetic field resonance phenomenon between the feeding coil and receiving coil. The wireless power receiver includes a loading circuit and a power controller. The loading circuit includes a loading coil that is magnetically coupled to the receiving coil to receive the AC power from the receiving coil and a load that receives the AC power supplied from the loading coil. The power controller includes a measurement unit and an adjustment unit. The measurement unit measures the receiving power of the load. The adjustment unit brings the receiving power close to its maximum value by changing the impedance of the loading circuit.

8 Claims, 20 Drawing Sheets

WIRELESS POWER RECEIVER, WIRELESS POWER TRANSMISSION SYSTEM, AND POWER CONTROLLER

CROSS REFERENCE TO RELATED APPLICATIONS

The present application claims priority from U.S. Provisional Application No. 61/447,854 filed on Mar. 1, 2011 and U.S. Provisional Application No. 61/447,863 filed on Mar. 1, 2011, the entire subject matters of which are incorporated herein by reference.

BACKGROUND OF THE INVENTION

1. Field of the Invention

The present invention relates to wireless power feeding and, more particularly, to power control thereof.

2. Description of Related Art

A wireless power feeding technique of feeding power without a power cord is now attracting attention. The current wireless power feeding technique is roughly divided into three: (A) type utilizing electromagnetic induction (for short range); (B) type utilizing radio wave (for long range); and (C) type utilizing resonance phenomenon of magnetic field (for intermediate range).

The type (A) utilizing electromagnetic induction has generally been employed in familiar home appliances such as an electric shaver; however, it can be effective only in a short range. The type (B) utilizing radio wave is available in a long range; however, it has small electric power. The type (C) utilizing resonance phenomenon is a comparatively new technique and is of particular interest because of its high power transmission efficiency even in an intermediate range of about several meters. For example, a plan is being studied in which a receiving coil is buried in a lower portion of an EV (Electric Vehicle) so as to feed power from a feeding coil in the ground in a non-contact manner. Hereinafter, the type (C) is referred to as "magnetic field resonance type".

The magnetic field resonance type is based on a theory published by Massachusetts Institute of Technology in 2006 (refer to Patent Document 1). In Patent Document 1, four coils are prepared. The four coils are referred to as "exciting coil", "feeding coil", "receiving coil", and "loading coil" in the order starting from the feeding side. The exciting coil and feeding coil closely face each other for electromagnetic coupling. Similarly, the receiving coil and loading coil closely face each other for electromagnetic coupling. The distance (intermediate distance) between the feeding coil and receiving coil is larger than the distance between the exciting coil and feeding coil and distance between the receiving coil and loading coil. This system aims to feed power from the feeding coil to receiving coil.

When AC power is fed to the exciting coil, current also flows in the feeding coil according to the principle of electromagnetic induction. When the feeding coil generates a magnetic field to cause the feeding coil and receiving coil to magnetically resonate, high current flows in the receiving coil. At this time, current also flows in the loading coil according to the principle of electromagnetic induction, and power is taken from a load connected in series to the loading coil. By utilizing the magnetic field resonance phenomenon, high power transmission efficiency can be achieved even if the feeding coil and receiving coil are largely spaced from each other (Refer to Patent Document 2 (Jpn. Pat. Appln. Laid-Open Publication No. 2006-230032), Patent Document 3 (International Publication No. WO2006-022365), and Patent Document 4 (U.S. Patent Application Publication No. 2009-0072629)).

CITATION LIST

Patent Document

[Patent Document 1] U.S. Pat. Appln. Publication No. 2008/0278264
[Patent Document 2] Jpn. Pat. Appln. Laid-Open Publication No. 2006-230032
[Patent Document 3] International Publication Pamphlet No. WO2006/022365
[Patent Document 4] U.S. Pat. Appln. Publication No. 2009/0072629
[Patent Document 5] Jpn. Pat. Appln. Laid-Open Publication No. 2010-141977
[Patent Document 6] Jpn. Pat. Appln. Laid-Open Publication No. 2001-238372

The present inventor considers that it is necessary to provide a mechanism for controlling the magnitude of receiving power in order to extend the applicability of wireless power feeding. In Patent Document 5 (Jpn. Pat. Appln. Laid-Open Publication No. 2010-141977), the input impedance on the power receiving side is adjusted by a variable capacitor to adjust the amount of charge (receiving power) for a battery. In the technique disclosed in Patent Document 5, the receiving power and capacitance value (electrostatic capacitance) of a variable capacitor are associated with each other and registered in a map. When the receiving power changes, the variable capacitor is adjusted with reference to the map so as to maintain the receiving power. However, the control method based on the assumption such as "map" is not adequate. This is because there exist various factors for changing the receiving power, so that it is impossible to guarantee that the receiving power can actually be maximized by the electrostatic capacitance after adjustment. In Patent Document 6 (Jpn. Pat. Appln. Laid-Open Publication No. 2001-238372), a power transmission state between power receiving circuits is detected/determined and, based on the determination result, the input impedance on the power receiving side is adjusted by a variable capacitor; however, the Patent Document 6 does not describe a concrete method for determining the power transmission state.

SUMMARY

An object of the present invention is to adjust the magnitude of the receiving power appropriately in magnetic field resonance wireless power feeding.

A wireless power receiver according to the present invention is a device that receives, at a receiving coil, AC power fed from a feeding coil by wireless using a magnetic field resonance phenomenon between the feeding coil and receiving coil. The wireless power receiver includes the receiving coil, a loading circuit, and a power controller. The loading circuit includes a loading coil that is magnetically coupled to the receiving coil to receive the AC power from the receiving coil and a load that receives the AC power supplied from the loading coil. The power controller includes a measurement unit that measures the receiving power and an adjustment unit that brings the receiving power close to its maximum value by changing the impedance of the loading circuit.

The power controller may control the receiving power itself or measure another index value correlated with the receiving power. For example, the power controller may measure current or voltage flowing in the load. Thus, the "receiving power" to be measured here is not limited to the receiving power itself but a concept including an index value one-to-one correlated with the receiving power.

By searching for the maximum value of the receiving power while adjusting the impedance, real-time power adjustment is enabled even during wireless power feeding. An optimum impedance is searched for while measuring the receiving power, so that the magnitude of the receiving power can easily be adjusted appropriately.

The adjustment unit may hold a target value of the receiving power, and the measurement unit may activate the adjustment unit when the receiving power decreases or increases by a predetermined value or more from the target value. The adjustment unit may hold the maximum value of the receiving power as a target value for next adjustment. The measurement unit may inactivate the adjustment unit when the receiving power has been maximized.

The adjustment unit may change a state of a resistance component of the impedance in one of increase and decrease directions, and the measurement unit may measure the increase/decrease in the receiving power occurring in association with the change in the state of the resistance component. Further, the adjustment unit may maintain the increase/decrease direction of the resistance component when the receiving power increases, while invert the increase/decrease direction when the receiving power decreases.

The loading circuit may include first and second LC circuits. The adjustment unit may perform first-stage adjustment for making the reactance components of the first and second LC circuits cancel each other and second-stage adjustment for adjusting the impedance so as to maximize the receiving power.

In the first-stage adjustment, the adjustment unit may adjust a first variable capacitor included in the first LC circuit such that the reactance components of the first and second LC circuits cancel each other, and in the second-stage adjustment, the adjustment unit may adjust second and third capacitors included respectively in the first and second LC circuits.

A wireless power transmission system according to the present invention feeds power by wireless from a feeding coil to a receiving coil using a magnetic field resonance phenomenon between the feeding coil and receiving coil. The system includes a wireless power feeder and a wireless power receiver. The wireless power feeder includes: the feeding coil; and a power transmission control circuit that supplies AC power to the feeding coil so as to make the feeding coil feed the AC power to the receiving coil. The wireless power receiver includes: the receiving coil; a loading circuit; and a power controller. The loading circuit includes a loading coil that is magnetically coupled to the receiving coil to receive the AC power from the receiving coil and a load that receives the AC power supplied from the loading coil. The power controller includes: a measurement unit that measures the receiving power; and an adjustment unit that maximizes the receiving power by changing the impedance of the loading circuit.

The power controller according to the present invention includes: a measurement unit that measures the receiving power of an electronic circuit including first and second LC circuits; and an adjustment unit that maximizes the receiving power by changing the impedance of the electronic circuit. The adjustment unit adjusts a first variable capacitor included in the first LC circuit such that the reactances of the first and second LC circuits cancel each other and then adjusts second and third capacitors included respectively in the first and second LC circuits.

According to the present invention, in wireless power feeding of a magnetic field resonance type, the magnitude of the receiving power can easily be adjusted appropriately.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be described below with reference to the accompanying drawings.

Figure 1:
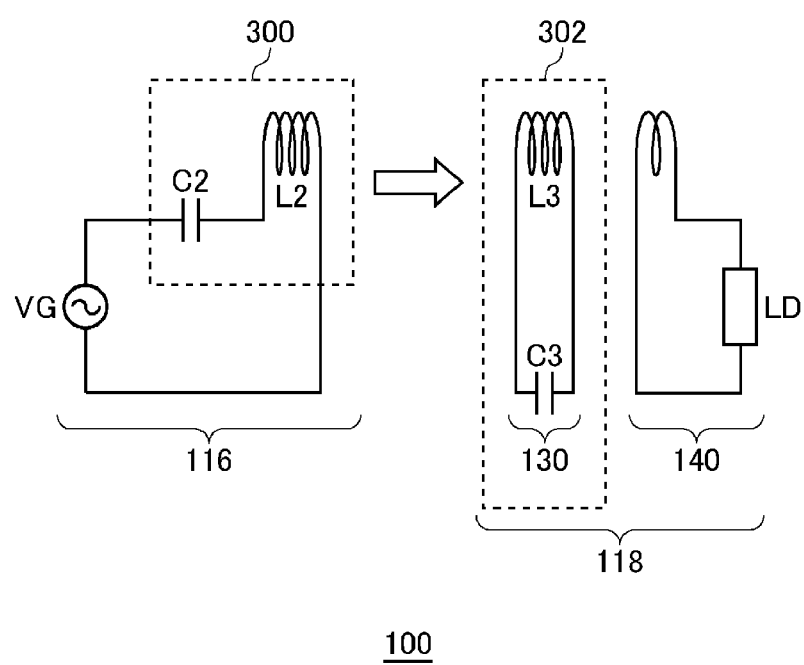
FIG. 1 is a view illustrating operation principle of a wireless power transmission system according to first and second embodiments.

FIG. 1 is a view illustrating operation principle of a wireless power transmission system 100 according to the first and second embodiment. The wireless power transmission system 100 in the first and second embodiments includes a wireless power feeder 116 and a wireless power receiver 118. The wireless power feeder 116 includes a power feeding LC resonance circuit 300. The wireless power receiver 118 includes a receiving coil circuit 130 and a loading circuit 140. A power receiving LC resonance circuit 302 is formed by the receiving coil circuit 130.

The power feeding LC resonance circuit 300 includes a capacitor C2 and a feeding coil L2. The power receiving LC resonance circuit 302 includes a capacitor C3 and a receiving coil L3. The values of the capacitor C2, feeding coil L2, capacitor C3, and receiving coil L3 are set such that the resonance frequencies of the feeding LC resonance circuit 300 and receiving LC resonance circuit 302 coincide with each other in a state where the feeding coil L2 and receiving coil L3 are disposed away from each other far enough to ignore the magnetic field coupling therebetween. This common resonance frequency is assumed to be fr0.

In a state where the feeding coil L2 and receiving coil L3 are brought close to each other in such a degree that they can be magnetic-field-coupled to each other, a new resonance circuit is formed by the power feeding LC resonance circuit 300, power receiving LC resonance circuit 302, and mutual inductance generated between them. The new resonance circuit has two resonance frequencies fr1 and fr2 (fr1<fr0<fr2) due to the influence of the mutual inductance. When the wireless power feeder 116 supplies AC power from a power feeding source VG to the power feeding LC resonance circuit 300 at the resonance frequency fr1, the power feeding LC resonance circuit 300 constituting a part of the new resonance circuit resonates at a resonance point 1 (resonance frequency fr1). When the power feeding LC resonance circuit 300 resonates, the feeding coil L2 generates an AC magnetic field of the resonance frequency fr1. The power receiving LC resonance circuit 302 constituting a part of the new resonance circuit also resonates by receiving the AC magnetic field. When the power feeding LC resonance circuit 300 and power receiving LC resonance circuit 302 resonate at the same resonance frequency fr1, wireless power feeding from the feeding coil L2 to receiving coil L3 is performed with the maximum power transmission efficiency. Received power is taken from a load LD of the wireless power receiver 118 as output power. Note that the new resonance circuit can resonate not only at the resonance point 1 (resonance frequency fr1) but also at a resonance point 2 (resonance frequency fr2).

Although FIG. 1 illustrates a configuration in which the wireless power feeder 116 does not include an exciting coil, the basic operation principle is the same as in the case where the wireless power feeder 116 includes the exciting coil.

Figure 2:
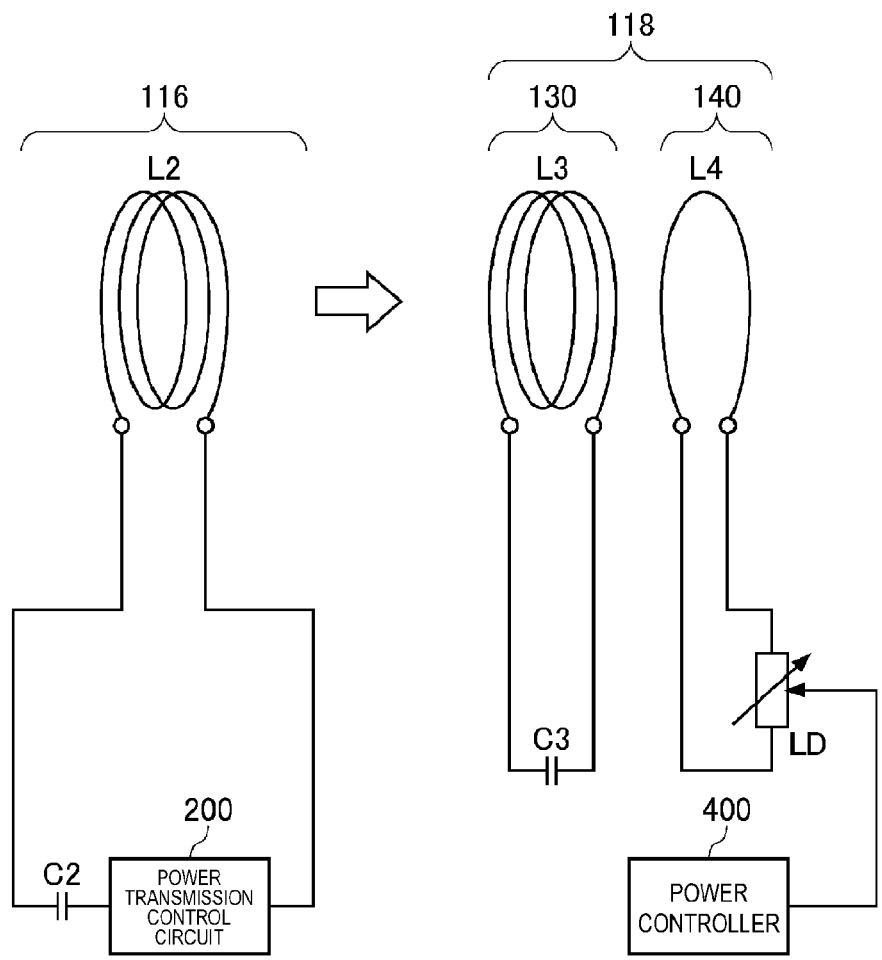
FIG. 2 is a system configuration view of the wireless power transmission system according to first and second embodiments.

FIG. 2 is a system configuration view of the wireless power transmission system 100 according to first and second embodiments. A power transmission control circuit 200 functions as an AC power supply and supplies AC power of a drive frequency fo to the feeding coil L2. The power transmission control circuit 200 in the first and second embodiments functions merely as a power feeding source VG (refer to FIG. 1). The drive frequency fo may be a fixed frequency. For example, the drive frequency fo may be set to the resonance frequency fr1. As a matter of course, the power transmission control circuit 200 may be configured to be able to change the drive frequency fo.

The wireless power receiver 118 includes a receiving coil circuit 130 and a loading circuit 140. In the receiving coil circuit 130, a power receiving LC resonance circuit 302 (refer to FIG. 1) is formed by the receiving coil L3 and capacitor C3. When the feeding coil L2 generates an AC magnetic field at the resonance frequency fr1, the feeding coil L2 and receiving coil L3 are strongly magnetic-field coupled to each other, causing AC current to flow in the receiving coil circuit 130. Both the wireless power feeder 116 and receiving coil circuit 130 are made to resonate by the AC magnetic field generated by the feeding coil L2.

The loading circuit 140 is a circuit in which a loading coil L4 and a load LD are connected in series. The receiving coil L3 and loading coil L4 face each other. The receiving coil L3 and loading coil L4 overlap each other, that is, the distance between them is zero. Thus, the receiving coil L3 and loading coil L4 are electromagnetically strongly coupled (coupling based on electromagnetic induction) to each other. When the AC current is made to flow in the receiving coil L3, an electromotive force occurs in the loading circuit 140 to cause AC current to flow in the loading circuit 140.

The AC power fed from the feeding coil L2 of the wireless power feeder 116 is received by the receiving coil L3 of the wireless power receiver 118 and taken from the load LD.

An impedance ZL of the load LD can be adjusted. The impedance ZL is adjusted by a power controller 400. It is assumed here that ZL is expressed as ZL=RL+jXL. An impedance Z of the loading circuit 140 as viewed from the receiving coil circuit 130 is expressed as Z=R+jX. The RL or R is a resistance component (real number part), and XL or X is a reactance component (imaginary number part). The j is an imaginary unit. Hereinafter, a method in which the receiving power of the load LD is maximized by adjusting the resistance component R (first embodiment) and by adjusting the reactance component X (second embodiment) will be described.

Figure 3:
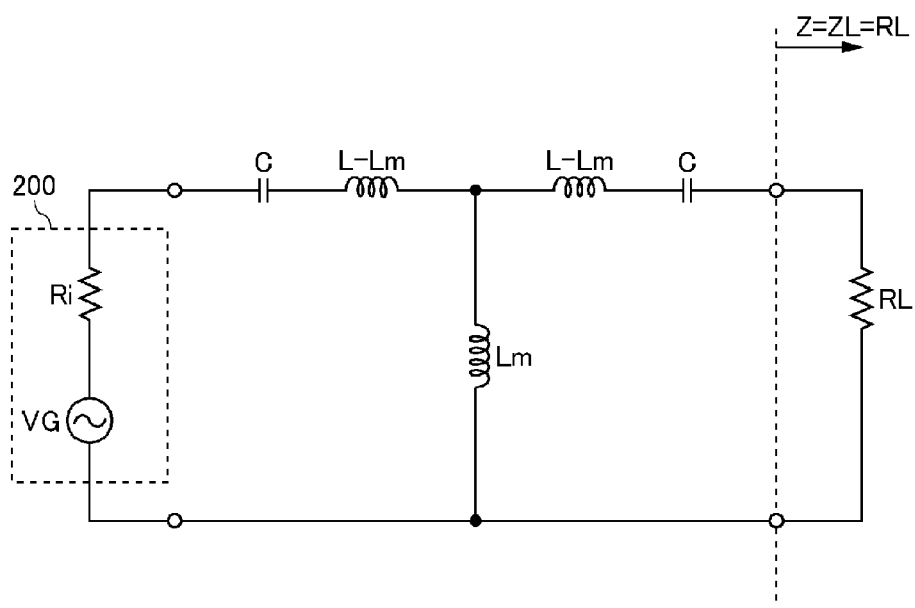
FIG. 3 is a basic equivalent circuit diagram of the wireless power transmission system.

FIG. 3 is an equivalent circuit diagram of the wireless power transmission system 100 according to the first embodiment. For simplification, the inductances of both the feeding coil L2 and receiving coil L3 are assumed to be L, and the capacitances of both the capacitor C2 and capacitor C3 are assumed to be C. The mutual inductance between the feeding coil L2 and receiving coil L3 is assumed to be Lm. A coupling factor k (=Lm/L) represents the strength of the magnetic field coupling between the feeding coil L2 and receiving coil L3. The larger the inter-coil distance is, the smaller the coupling factor k becomes. Ri is a resistance component of the output impedance of the power transmission control circuit 200.

In FIG. 3, it is assumed that Z=ZL=RL be satisfied for simplification. Although the impedance component actually contains the reactance component X or XL, a description will be made only for the resistance component R (=RL) in FIGS. 3 to 5.

Figure 4:
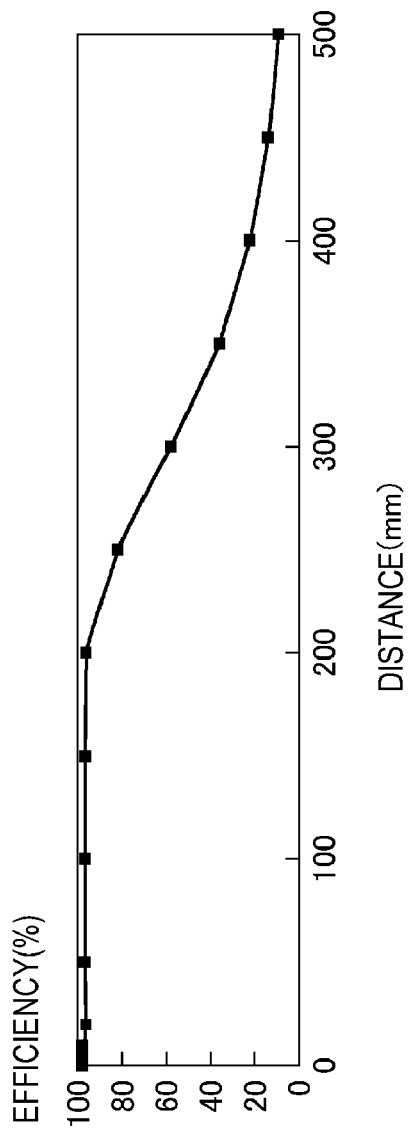
FIG. 4 is a graph illustrating the relationship between inter-coil distance and power transmission efficiency.

FIG. 4 is a graph illustrating the relationship between the inter-coil distance and power transmission efficiency. The resonance frequency fr1 depends on the inter-coil distance. The power transmission control circuit 200 makes the drive frequency fo track the resonance frequency fr1 to thereby maintain the power transmission efficiency even when the inter-coil distance changes. FIG. 4 illustrates a change in the power transmission efficiency in such a frequency tracking type system. According to the graph of FIG. 4, although the power transmission efficiency can be maintained at the maximum level when the inter-coil distance is 200 mm or less, it is impossible to maintain the power transmission efficiency only by making the drive frequency track the resonance frequency when the inter-coil distance exceeds 200 mm.

Figure 5:
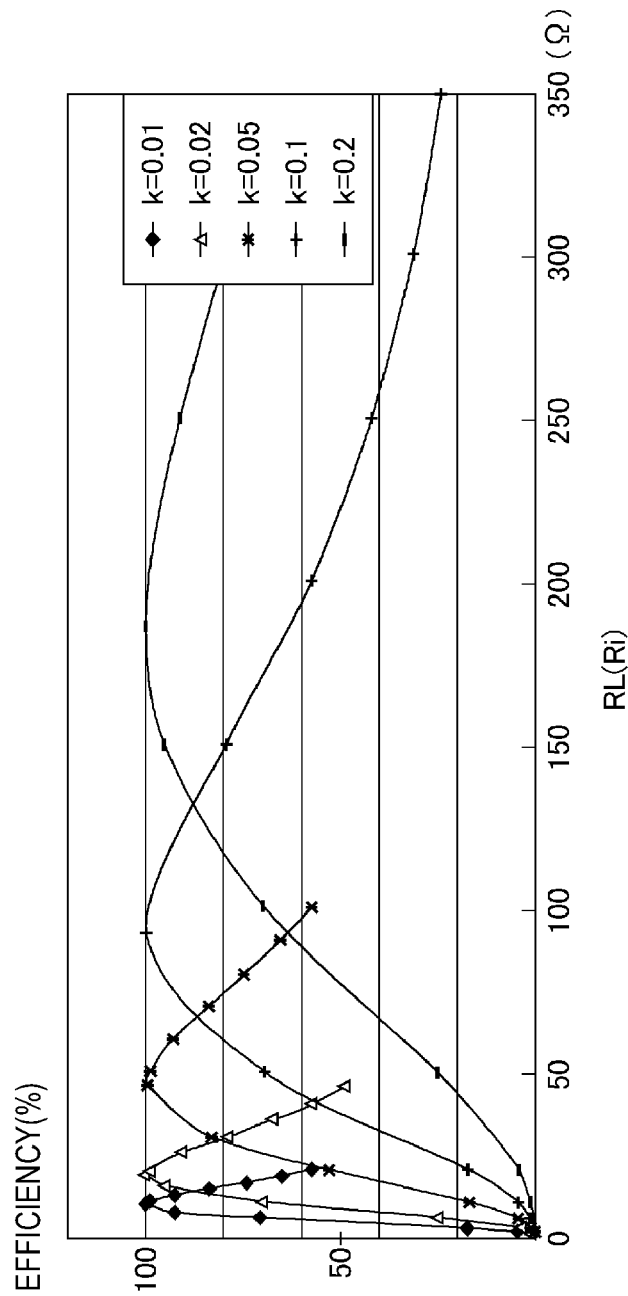
FIG. 5 is a graph illustrating a change in the power transmission efficiency when resistances RL and Ri are adjusted simultaneously.

FIG. 5 is a graph illustrating a change in the power transmission efficiency when the resistances RL and Ri are adjusted simultaneously. FIG. 5 illustrates a case where the inductance L is 8.5 µH, capacitance C is 10 pF, and drive frequency fo is 17.272 MHz. The drive frequency fo is represented as $1/(2\cdot\pi\cdot(L\cdot C)^{1/2})$. The values of the resistances RL and Ri are the same, and the graph of FIG. 5 illustrates a change in the power transmission efficiency when the values of the resistances RL and Ri are adjusted simultaneously. There is a correlation between the resistance RL and power transmission efficiency, so that it is possible to maintain the power transmission efficiency by adjusting the resistance RL in accordance with the inter-coil distance. According to FIG. 5, the smaller the coupling factor k, that is, the larger the inter-coil distance, the more the resistance RL needs to be reduced in order to maintain the power transmission efficiency. For example, when the coupling factor k is 0.2, the power transmission efficiency becomes maximum when RL (=Ri) is 184.4 (Ω), and when the coupling factor k is 0.05, the power transmission efficiency becomes maximum when RL (=Ri) is 46.1 (Ω). Based on the equivalent circuit of FIG. 3, the impedance Z (=Ri=RL) at which the power transmission efficiency becomes maximum can be represented as $Z^2=Lm^2/(L\cdot C)=k^2\cdot L/C$. Thus, by adjusting the impedance Z in accordance with the coupling factor k, the power transmission efficiency can be controlled.

Figure 6:
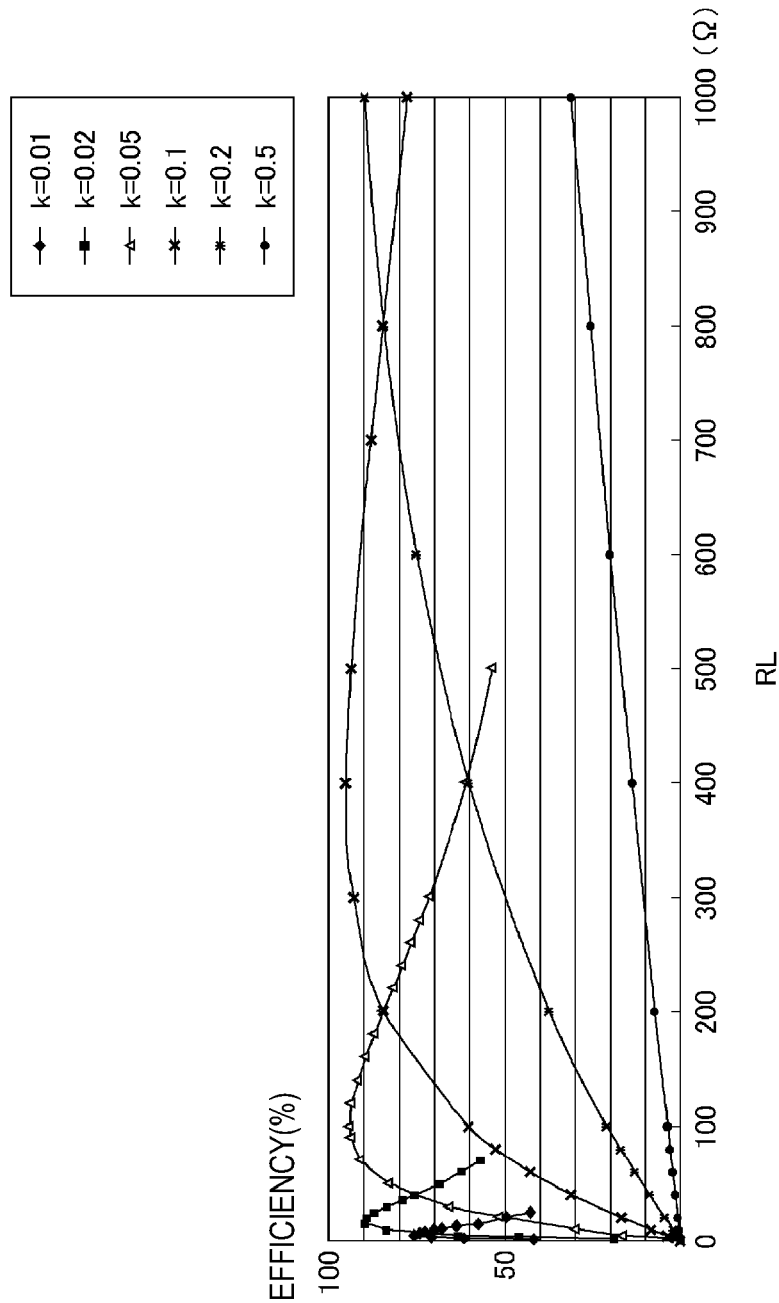
FIG. 6 is a graph illustrating a change in the power transmission efficiency when the resistance RL is adjusted while the resistance Ri is fixed.

FIG. 6 is a graph illustrating a change in the power transmission efficiency when the resistance RL is adjusted while the resistance Ri is fixed. FIG. 6 illustrates a case where the inductance L is 8.5 µH, capacitance C is 10 pF, resistance Ri is 20Ω, and drive frequency fo is 17.272 MHz. Also in this case, the impedance Z at which the power transmission efficiency becomes maximum can be calculated, so that the power transmission efficiency can be controlled based on the adjustment of the resistance RL.

When the inter-coil distance changes, the resonance frequency fr1 also changes. One method for maintaining the power transmission efficiency is a method in which the power transmission control circuit 200 makes the drive frequency fo track the resonance frequency fr1 so as to maintain a resonance state of the power receiving LC resonance circuit 302 and the like. Another method for maintaining the power transmission efficiency is a method of adjusting the impedance Z (e.g., resistance RL) on the power receiving side so as to maximize the power transmission efficiency (receiving power). In the present embodiments, the latter method is taken up. Although the drive frequency fo is a fixed value in the following description, it may be a variable value.

First Embodiment

Figure 7:
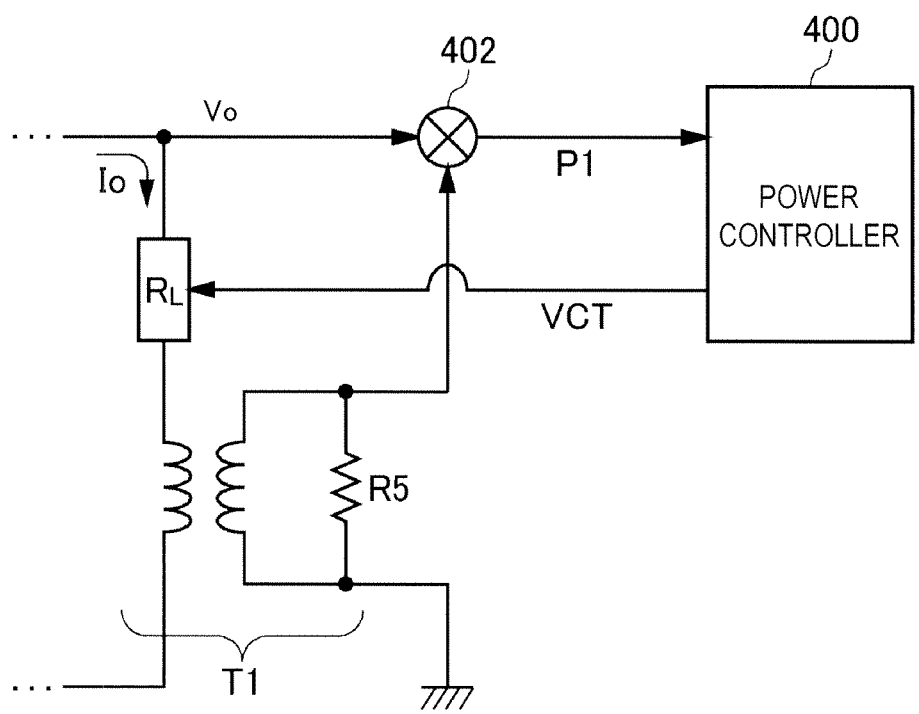
FIG. 7 is a circuit diagram of a connecting portion between a power controller and a loading circuit in the first embodiment.

FIG. 7 is a circuit diagram of a connecting portion between the power controller 400 and loading circuit 140 in the first embodiment. In the first embodiment, the real number part R of the impedance Z is set as a control target. It is assumed here that Z=R+jX, ZL=RL, and R=RL are satisfied. The power controller 400 measures the power (receiving power) of the resistance RL and searches for a resistance value at which the receiving power becomes the maximum while changing the value of the resistance RL.

Voltage Vo applied to the resistance RL is input to a mixer 402. The magnitude of current Io flowing in the resistance RL is measured as a voltage value by a transformer T1 and is then input to the mixer 402. More specifically, a voltage value of Io×R5 is applied to a parallel resistance R5 of the transformer T1 and this voltage value is input to the mixer 402. As a result, the mixer 402 outputs Vo×Io×R5 which is a value obtained by multiplying the two inputs (Vo and Io×R5). That is, from the mixer 402, a power signal 21 proportional to the receiving power is input to the power controller 400. The power controller 400 adjusts the resistance RL such that the power signal P1 becomes the maximum value.

Figure 8:
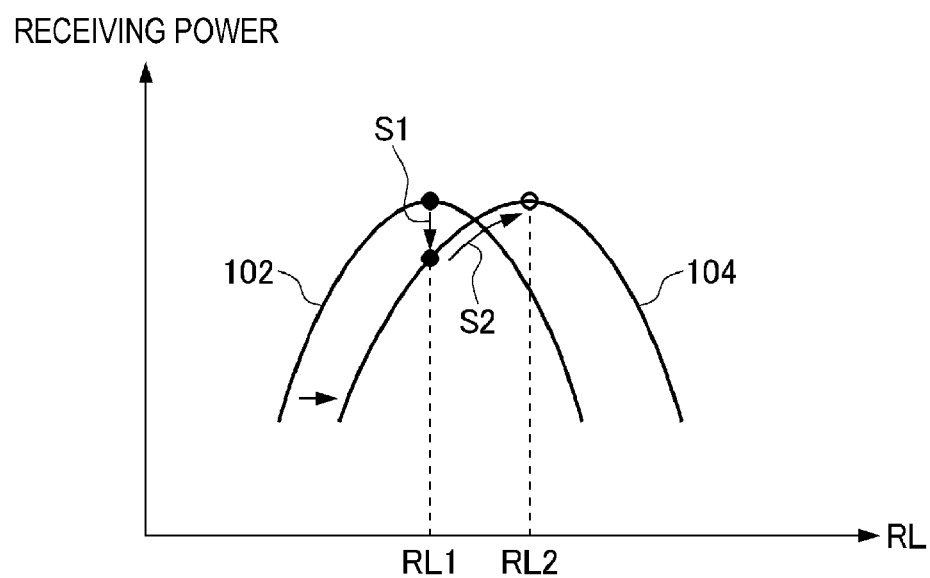
FIG. 8 is a schematic view for explaining a method for maximizing receiving power.

FIG. 8 is a schematic view for explaining a method for maximizing the receiving power. Here, a description will be made on the assumption that the relationship between the receiving power and resistance RL changes from a before-change-characteristic 102 to an after-change-characteristic 104 after change for some reason such as a change in the inter-coil distance. In the before-change-characteristic 102, when RL is set to RL1, the receiving power (power transmission efficiency) becomes maximum (maximum value).

Assume that the characteristic changes from the before-change-characteristic 102 to after-change-characteristic 104 in case that RL is set to RL1. In the after-change-characteristic 104, the receiving power at the point RL1 (=RL) is reduced (S1). When the actual receiving power is reduced from the maximum value in the before-change-characteristic 102 by a predetermined amount or more, the power controller 400 increases or reduces the resistance RL so as to search for a "new" maximum value. In the example of FIG. 8, the receiving power becomes the maximum value once again when the resistance RL is increased from RL1 to RL2 (S2). In the case where the maximum value of the receiving power (power transmission efficiency) in the before-change-characteristic 102 is smaller than the maximum value of the receiving power (power transmission efficiency) in the after-change-characteristic 104, the receiving power at the point RL1 (=RL) can rather increase after the change. Also in this case, the power controller 400 increases or reduces the resistance RL so as to search for a new maximum value.

That is, the method employed in the present embodiment does not theoretically set a target value as in the method disclosed in Patent Document 5, but actually searches for an optimum resistance value in a trial-and-error manner while measuring the receiving power.

Figure 9:
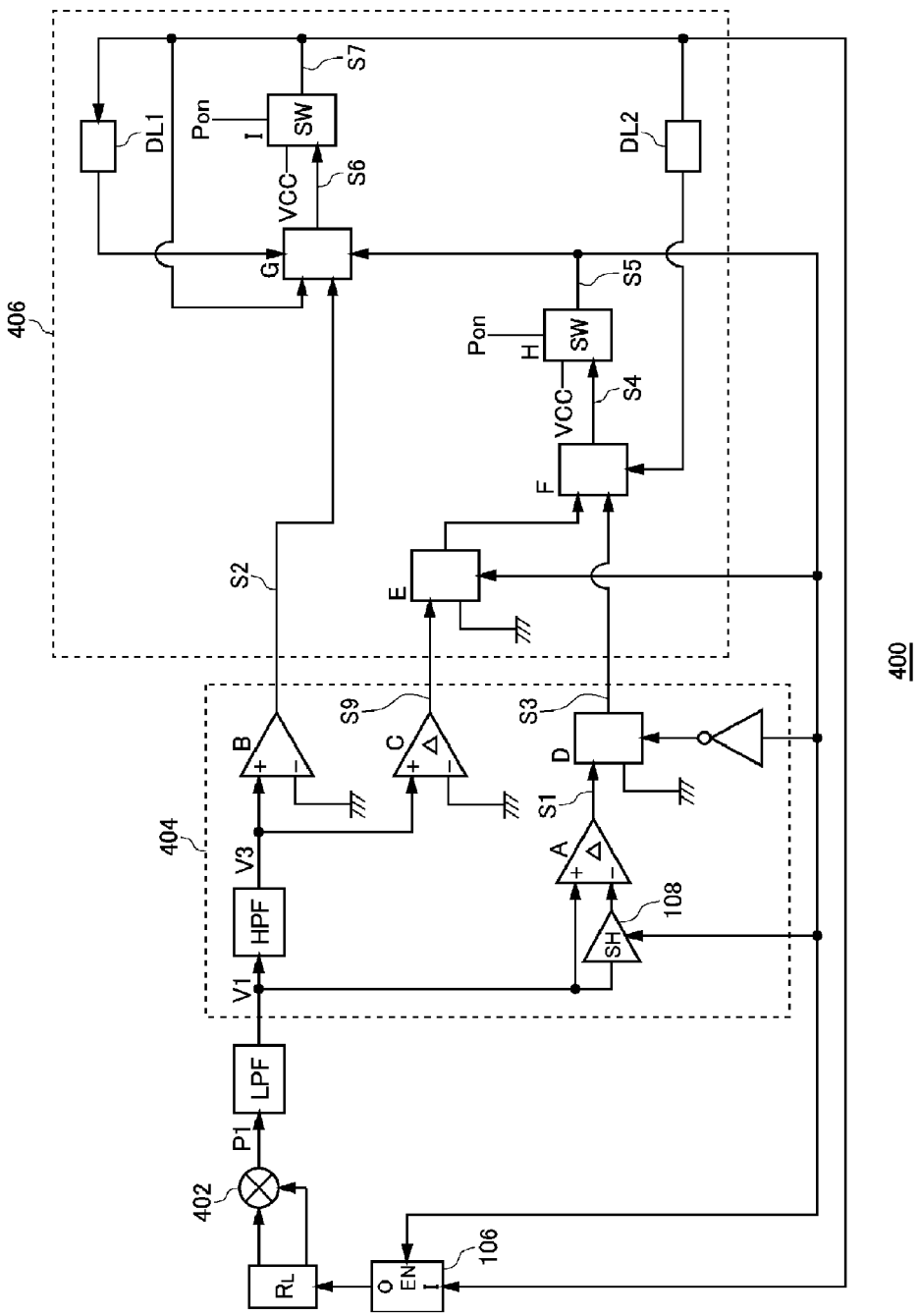
FIG. 9 is a circuit diagram of a power controller in the first embodiment.

FIG. 9 is a circuit diagram of the power controller 400 in the first embodiment. A voltage signal V3 represents the slope of a voltage signal V1 (power signal P1) before and after the elapse of a predetermined time period. The function of the power controller 400 is roughly divided in two: one is a function of monitoring the power signal P1 (measurement unit 404); and the other is a function of adjusting the resistance RL (adjustment unit 406). The power signal P1 (=Vo×Io×R5) output from the mixer 402 is subjected to signal component removal by a low-pass filter LPF and is then input to a slope detection circuit and a comparator A as the voltage signal V1. The slope detection circuit detects a change in the voltage signal V1 (power signal P1) and is constituted by a high-pass filter (HPF) in the present embodiment. More concretely, the voltage signal V3 represents the magnitude and direction of a change in the voltage signal V1 (power signal P1) occurring in the wake of a change in the inter-coil distance or adjustment of the resistance RL (to be described later). That is, the voltage signal V3 represents the slope of the voltage signal V1 (power signal P1) before and after the elapse of a predetermined time period. The voltage signal V3 may represent the increase/decrease direction and its magnitude itself of the voltage signal V1 or may represent increase/decrease and its magnitude of the voltage signal V1 based on the comparison with a predetermined reference potential. Hereinafter, a description will be made on the assumption that the voltage signal V3 represents the increase/decrease direction and its magnitude itself of the voltage signal V1. In the case where the increase/decrease and its magnitude of the voltage signal V1 is represented based on the comparison with a predetermined reference potential, the reference potential should be set to the inverting input terminals of comparators B and C to be described later. Among various circuits included in the power controller 400, comparators A, B, and C play a particularly important role and, thus, the configurations of these comparators will be described first.

Comparator A:

The comparator A is a circuit for activating an adjustment function and compares the voltage signal V1 held by a sample-hold circuit 108 with a newly measured voltage signal V1. The sample-hold circuit 108 holds the voltage signal V1 corresponding to the previous maximum value. When the characteristic changes from the before-change-characteristic 102 to after-change-characteristic 104 as illustrated in FIG. 8, the sample-hold circuit 108 holds the voltage signal V1 corresponding to the maximum value in the before-change-characteristic 102.

When the voltage signal V1 after measurement becomes lower or higher than the voltage signal V1 (hereinafter, referred to as "V1SH") by a TH1 or more, the comparator A activates a signal S1 to a high level. In other words, when the receiving power significantly decreases or increases by the characteristic change from the before-change-characteristic 102 to after-change-characteristic 104, the comparator A asserts the signal S1. More concretely, the signal S1 is a signal that assumes a high level when V1≥V1SH+TH1 or V1≤V1SH-TH1 is satisfied and, otherwise, assumes a low level. The TH1 is a threshold value set for preventing overreaction of the comparator A. Although the details will be described later, when the signal S1 is activated to a high level, output signals of a switch circuit D, a load resistance hold signal generation circuit F, and switch circuit H are sequentially activated to activate the adjustment unit 406.

Comparator B:

The comparator B checks whether the receiving power tends to increase or decrease. As described above, the slope detection circuit outputs the voltage signal V3 representing the increase/decrease direction and its magnitude of the voltage signal V1. The voltage signal V3 is input to the comparators B and C. When the voltage signal V3 is increasing, that is, when the receiving power is increasing, the comparator B activates a signal S2 to a high level. When the receiving power is decreasing, the comparator B inactivates the signal S2 to a low level. When the receiving power tends to increase (tends to be improved by the adjustment) by increase/decrease in the resistance RL, the signal S2 assumes a high level, while when the receiving power tends to decrease (tends not to be improved by the adjustment) by increase/decrease in the resistance RL, the signal S2 assumes a low level. Thus, it is possible to confirm whether the adjustment of the resistance RL goes well or not by referring to the signal S2.

Comparator C:

The comparator C inactivates a signal S9 to a low level when the receiving power hardly changes even if the resistance RL is changed. In the vicinity of the maximum value, the receiving power hardly changes even if the resistance RL is changed. That is, the comparator C is a circuit for determining whether the receiving power is near the maximum value. A threshold value TH2 is set in order to determine whether the receiving power is near the maximum value. An output signal S9 assumes a high level when V3≥TH2 or V3≤−TH2 is satisfied and, otherwise (−TH<V3<TH2 is satisfied), assumes a low level. The TH2 is a threshold set so as to allow the comparator C to react only when the receiving power is sufficiently near the maximum value.

Based on the assumptions described above, operation of the power controller 400 will be described below. Here, assumed is a case where the optimum value of the resistance RL is changed from RL1 to RL2 in association with the characteristic change from the before-change-characteristic 102 to after-change-characteristic 104.

The sample-hold circuit 108 provided at the input part of the comparator A holds the voltage signal V1 corresponding to the maximum value in the before-change-characteristic 102, in other words, voltage signal V1 corresponding to the resistance value RL1. A load control circuit 106 generates, from a control signal S7, a load control signal corresponding to the resistance value RL1 and holds it. The load control signal designates the value of the resistance RL.

The voltage signal V1 decreases in association with the characteristic change from the before-change-characteristic 102 to after-change-characteristic 104 (refer to FIG. 8). When a newly measured voltage signal V1 becomes lower than the held voltage signal V1 by the TH1 or more, the comparator A activates the signal S1 to a high level. A switch circuit D activates a signal S3 to a high level, load resistance hold signal generation circuit F activates a signal S4 to a high level, and a switch circuit H activates a control signal S5 to a high level. The activation of the control signal S5 activates an inactivated switch circuit E to thereby make the adjustment function effective. The activation of the control signal S5 inactivates the switch circuit D, disabling the comparator A once. Further, the activation of the control signal S5 activates the load control circuit 106. When being activated, the load control circuit 106 adjusts the resistance RL according to a signal S7 to be described later.

More concretely, when the control signal S5 assumes a low level, the output of the comparator A becomes the output signal S3 of the switch circuit D. Thus, when the signal S1 is activated to a high level, the signal S3 is also activated to a high level, load resistance hold signal generation circuit F activates the signal S4 to a high level, and switch circuit H activates the control signal S5 to a high level. The output of the load resistance hold signal generation circuit F assumes a high level at the rising edge of the output of the switch circuit D and assumes a low level at the falling edge of the output of the switch circuit E. However, when the output of an invalidation circuit DL2 assumes a high level, the signal S4 does not return to a low level even when the output of the switch circuit E assumes a low level. The invalidation circuit DL2 maintains output of a high level signal for a predetermined time period after the rising edge or falling edge of the signal S7. This is to prevent the signal S5 from being low level as the result that the slope of the signal V1 becomes zero and then the signal S9 becomes a low level every time the signal S7 is inverted (detailed logic will be described later). A PON (Power On Signal) to be input to the control terminal of the switch circuit H assumes a high level at the rising edge of a power supply to select a power supply voltage VCC and assumes a low level at the falling edge of the output of the comparator C to select the signal S4 of the load resistance hold signal generation circuit F. The same goes for a switch circuit I. In the initial stage, both the control signals S5 and S7 are set to a high level. When the control signal S5 is activated, the inactivated switch circuit E is activated to select the output of the comparator C, making the adjustment function effective. The switch circuit E is provided for the purpose of preventing the signal S9 from rising to a high level or falling to a low level depending on the distance between the power feeding side and power receiving side even when the control signal S5 assumes a low level and the load resistance RL is fixed. That is, when the control signal S5 assumes a low level, the output of the switch circuit E assumes a ground potential. When the control signal S5 is activated, the output of the switch circuit D assumes a low level, and the comparator A is invalidated once. After the activation of the control signal S5, the switch circuit D sets the signal S3 to a ground potential. As a result, the load resistance hold signal generation circuit F is controlled by the signal S9. Further, the activation of the control signal S5 activates the load control circuit 106. When being activated, the load control circuit 106 converts a signal S7 to be described later into a load resistance control signal so as to adjust the resistance RL.

When the control signal S5 is activated, a load resistance control command signal generation circuit G activates a signal S6, and the switch circuit I activates the signal S7 to a high level. When the signal S7 is activated to a high level, the load control circuit 106 increases the resistance RL. The resistance RL may be increased or decreased in the initial stage. In the present embodiment, the resistance RL is increased in the first place.

The load resistance control command signal generation circuit G holds the value of the signal S6 when the signal S2 assumes a high level, while inverts the value of the signal S6 when the signal S2 assumes a low level. However, when the output of an invalidation circuit DL1 assumes a high level, the load resistance control command signal generation circuit G does not invert the value of the signal S6 but holds it without change even when the signal S2 assumes a low level. The invalidation circuit DL1 maintains output of a high level signal for a predetermined time period after the rising edge or falling edge of the signal S7. When the signal S2 assumes a low level, the signal S6 repeats inversion; however, the invalidation circuit DL1 prevents the inversion signal from being repeatedly input to the load resistance control command signal generation circuit G. Concretely, the invalidation circuit DL1 invalidates the load resistance control command signal generation circuit G for a certain time even when the signal S7 is inverted so as to maintain the level of the signal S7 at a level after the inversion. Although not illustrated, a buffer for generating delay time not less than the invalidation time period of the load resistance control command signal generation circuit G is provided in the middle of a path from the signal S7 to the input of the load resistance control command signal generation circuit G. The signal S6 assumes a high level only when the control signal S5 assumes a high level.

(1) Case where Receiving Power Increases with Increase in Resistance RL

When the resistance RL is increased, the voltage signals V1 and V3 also change. When the voltage signal V3 increases, which means that the receiving power steadily increases with the increase in the resistance RL, so it can be said that the adjustment of the resistance RL has worked out. When the value of the voltage signal V3 becomes TH2 or more, the comparator C activates the signal S9; however, this activation gives no influence on the load resistance hold signal generation circuit F at the subsequent stage.

Since the receiving power has increased, the output signal S2 of the comparator B assumes a high level. When the signal S2 assumes a high level, the load resistance control command signal generation circuit G maintains its output without change. Therefore, the resistance RL continues to be increased. In the case where the receiving power increases with a reduction in the resistance RL, the resistance RL continues to be reduced.

(2) Case where Receiving Power Decreases with Increase in Resistance RL

In the case where the receiving power has decreased with an increase in the resistance RL, the resistance RL should not be increased but reduced. Also at this time, the comparator C activates the signal S9 when the value of the voltage signal V3 becomes −TH2 or less; however, this activation gives no influence on the load resistance hold signal generation circuit F at the subsequent stage.

Since the receiving power has decreased, the output signal S2 of the comparator B assumes a low level. When the signal S2 assumes a low level, the load resistance control command signal generation circuit G inverts its output. As a result, the signal S6 output from the load resistance control command signal generation circuit G changes from a high level to a low level. The signal S7 of the switch circuit I also changes from a high level to a low level, so that the load control circuit 106 reduces the resistance RL. In the case where the receiving power decreases with a reduction in the resistance RL, the resistance RL is increased.

As described above, during a time period during which the signal S2 assumes a low level, the signal S6 repeats inversion. The invalidation circuit DL1 is adopted in order to prevent such repetition of the inversion. When the signal S7 is inverted, the invalidation circuit DL1 invalidates the load resistance control command signal generation circuit G for a certain time. Therefore, the level of the signal S7 is maintained at a level after the inversion. When the signal S7 is inverted, the resistance RL changes from the increasing state to decreasing state. Accordingly, the receiving power changes from the decreasing state to increasing state to cause the signal S2 to assume a high level. When the load resistance control command signal generation circuit G is made effective after the signal S2 has assumed a high level, the level of the signal S7 can be maintained afterward. The invalidation circuit DL2 is provided corresponding to the load resistance hold signal generation circuit F and has the same role as that of the invalidation circuit DL1.

(3) Case where Increase/Decrease in Receiving Power in Association with Increase/Decrease in Resistance RL Slows Down As the receiving power becomes close to the maximum value in association with increase or decrease in the resistance RL, the increasing rate of the voltage signal V3 slows down. When the receiving power has become comparable to the maximum value, the comparator C inactivates the signal S9 to a low level. Concretely, in the example shown in FIG. 8, the comparator C inactivates the signal S9 when the RL is increased near RL2. At this time, the outputs of the switch circuit E and load resistance hold signal generation circuit F are also inactivated to a low level. Accordingly, the signal S5 output from the switch circuit H assumes a low level, output of the switch circuit E assumes a ground potential, and the adjustment unit 406 is inactivated. Thus, the switch circuit D is activated, followed by reactivation of the measurement function. The load control circuit 106 holds, according to the control signal S5, the load resistance control signal generated from the signal S7. The load resistance control signal generated from the signal S7 at this time corresponds to the resistance value RL2. The sample-hold circuit 108 holds, according to the control signal S5, the voltage signal V1. That is, the voltage signal V1 corresponding to the resistance value RL2 is a target value at the next adjustment time. Thus, the adjustment of the resistance RL has been completed.

To summarize, in the initial state, the measurement unit 404 is activated, while the adjustment unit 406 is inactivated. When the comparator A has detected significant decrease or increase of the receiving power, the adjustment unit 406 is activated to start adjusting the resistance RL. The comparator B is used to check increase/decrease in the receiving power while changing the resistance RL. In the case where the receiving power decreases when the resistance RL is increased or decreased, the increase/decrease direction is inverted. When the receiving power has become comparable to the maximum value, the comparator C reacts to inactivate the signal S9, resulting in inactivation of the adjustment unit 406. The voltage signal V1 corresponding to the maximum value or load resistance control signal generated from the signal S7 is held. According to such a control method, it is possible to automatically search for/set an optimum value of the resistance RL even when the receiving power significantly decreases or increases.

Second Embodiment

Figure 10:
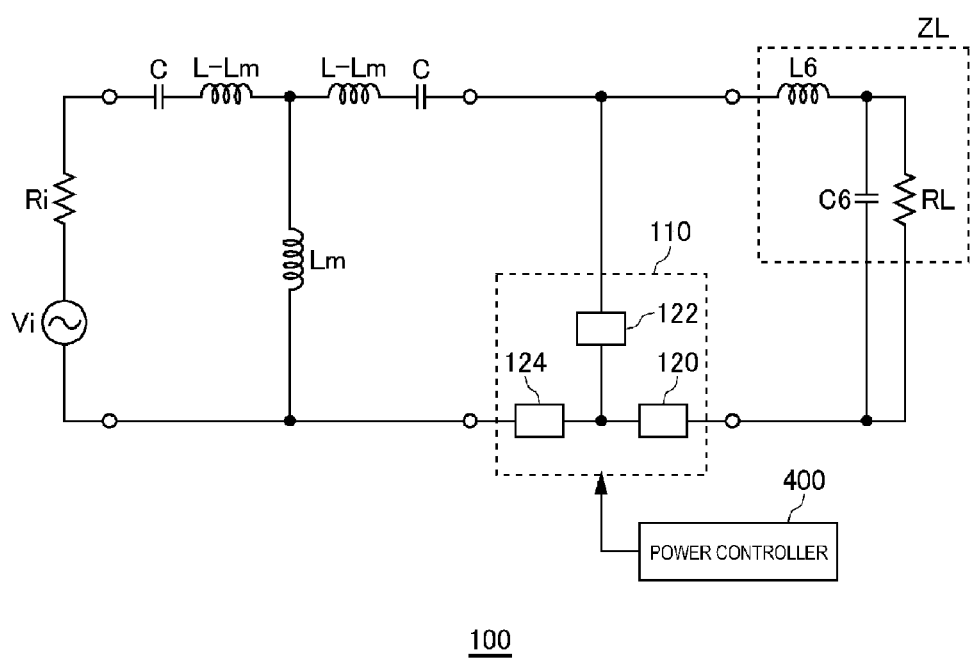
FIG. 10 is an equivalent circuit diagram of the wireless power transmission system according to a second embodiment.

FIG. 10 is an equivalent circuit diagram of the wireless power transmission system according to a second embodiment. For simplification, the inductances of both the feeding coil L2 and receiving coil L3 are assumed to be L, and the electrostatic capacitances of both the capacitor C2 and capacitor C3 are assumed to be C, as in the case of the first embodiment. The mutual inductance between the feeding coil L2 and receiving coil L3 is assumed to be Lm. In the second embodiment, both the resistance component (real number part) and reactance component (imaginary number part) of the impedance Z are set as control targets.

In the second embodiment, a reactance unit 110 is newly provided. The reactance unit 110 includes a first reactance unit 120, a second reactance unit 122, and a third reactance unit 124. The power controller 400 adjusts the reactance of the reactance unit 110 to thereby maximize the receiving power at the load LD.

For clearing noise, a coil L6 and a capacitor C6 are added to the resistance component RL. A reactance component XL of ZL=RL+jXL contains the inductance of the coil L6 or electrostatic capacitance of the capacitor C6. The impedance ZL is not set as an adjustment target. Actually, the reactance component XL contains various reactance components of the load LD.

Figure 11:
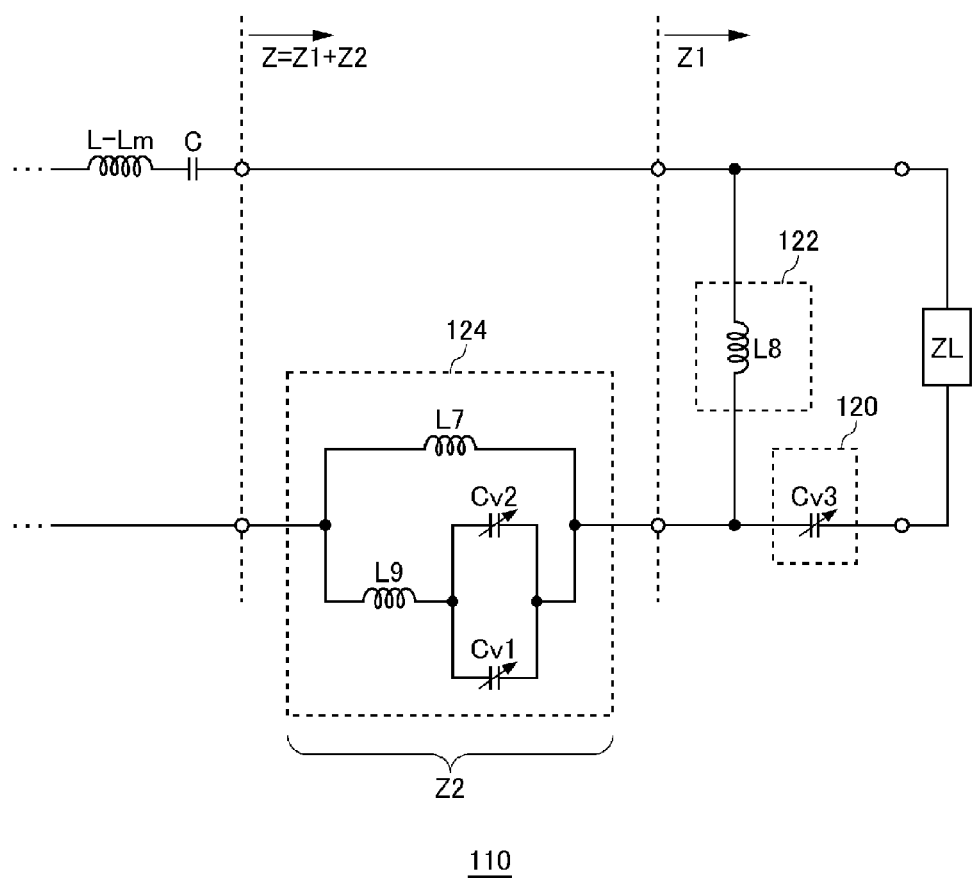
FIG. 11 is a circuit diagram of a reactance unit.

FIG. 11 is a circuit diagram of the reactance unit 110. The third reactance unit 124 includes a coil L7, a coil L9, and variable capacitors Cv1 and Cv2 (first and second variable capacitors). The first reactance unit 120 includes a variable capacitor Cv3 (third variable capacitor). The second reactance unit 122 includes a coil L8. An impedance obtained by adding the impedance ZL to the first reactance unit 120 and second reactance unit 122 is assumed to be Z1 (=R1+jX1). The impedance of the third reactance unit 124 is assumed to be Z2 (=R2+jX2). The input impedance Z as viewed from the receiving coil circuit 130 to the loading circuit 140 is represented by Z1+Z2. The reactance component and resistance component of the impedance Z are adjusted by the variable capacitors Cv1, Cv2, and Cv3.

Figure 12:
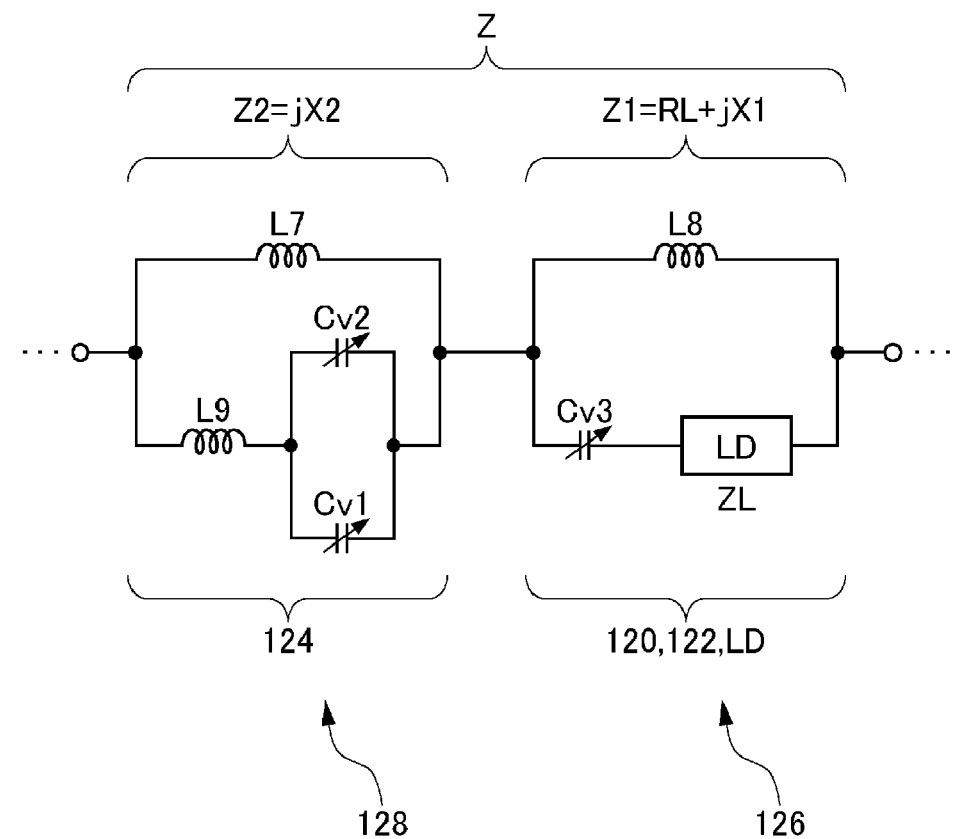
FIG. 12 is an equivalent circuit diagram of the reactance unit and load.

FIG. 12 is an equivalent circuit diagram of the reactance unit 110 and load LD. The third reactance unit 124 includes coils and capacitors only, so that R2 is zero in "impedance Z2=R2+jX2". The impedance Z2 can be equivalently expressed as the impedance of the LC circuit (second LC circuit 128).

The load LD contains the resistance component (RL), so that the impedance Z1 (=R1+jX1) contains both the resistance component and reactance component. The reactance component of the impedance Z1 can be considered as the impedance component of the equivalent LC circuit (first LC circuit 126) consisting of the coil L8, variable capacitor Cv3, and coil L6. The resistance value RL or capacitance of the capacitor C6 give little influence on the reactance component of the impedance Z1, so that it is substantially unnecessary to take the resistance RL and capacitor C6 into consideration when the reactance component of the impedance Z1 is treated. The first LC circuit 126 and second LC circuit 128 are connected in series, so that the reactance component X of the impedance Z corresponds to the synthesis of a reactance component X1 of the first LC circuit 126 and a reactance component X2 of the second LC circuit 128. The circuit configurations of the first and second LC circuits 126 and 128 are similar to each other. That is, in the second LC circuit 128, the inductor L7 is parallel-connected to a series connected circuit of the inductor L9 and variable capacitors (Cv1+Cv2). In the first LC circuit 126, the inductor L8 is parallel-connected to a series connected circuit of the inductor L6 and variable capacitor Cv3. Thus, the reactance component X of the impedance Z can easily be adjusted.

In order to increase the receiving power, it is desirable to set the imaginary number part (X1+X2) of the impedance Z (=Z1+Z2=R1+j(X1+X2)) to zero. When X1 cancels X2, that is, when X1=−X2 is satisfied, the imaginary number part of the impedance Z is zero. In the second embodiment, the receiving power is maximized by adjusting the variable capacitors Cv1, Cv2, and Cv3. More concretely, as a first stage, the variable capacitor Cv1 is adjusted to make X1 and X2 to cancel each other, whereby the receiving power is increased. Subsequently, as a second stage, while maintaining a state where X1 and X2 cancel each other (while maintaining the imaginary number part of the impedance Z at zero), the variable capacitors Cv2 and Cv3 are adjusted to adjust the real number part of the impedance Z to thereby maximize the receiving power. The total electrostatic capacitance of the variable capacitors Cv2 and Cv3 is constant. Hereinafter, the magnitudes of the electrostatic capacitances of the variable capacitors Cv1, Cv2, and Cv3 are referred to, respectively, as Cc1, Cc2, and Cc3. In order to maximize the receiving power according to the above procedure, it is preferable that the inductor L8 of the first LC circuit 126 and inductor L7 of the second LC circuit 128 have the same inductance and that the inductor L6 of the first LC circuit 126 and inductor L9 of the second LC circuit 128 have the same inductance.

Figure 13:
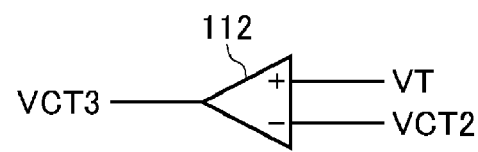
FIG. 13 is a view illustrating a subtractor for controlling the electrostatic capacitances of the variable capacitors Cv2 and Cv3.

FIG. 13 is a view illustrating a subtractor 112 for controlling the electrostatic capacitances of the variable capacitors Cv2 and Cv3. The electrostatic capacitances Cc2 and Cc3 of the variable capacitors Cv2 and Cv3 are controlled respectively by control voltages VCT2 and VCT3. A relationship represented as "VT−VCT2=VCT3" is established by the subtractor 112 between the control voltages VCT2 and VCT3. VT is a predetermined fixed voltage. That is, [VCT2+VCT3] is controlled to be always constant.

Figure 14:
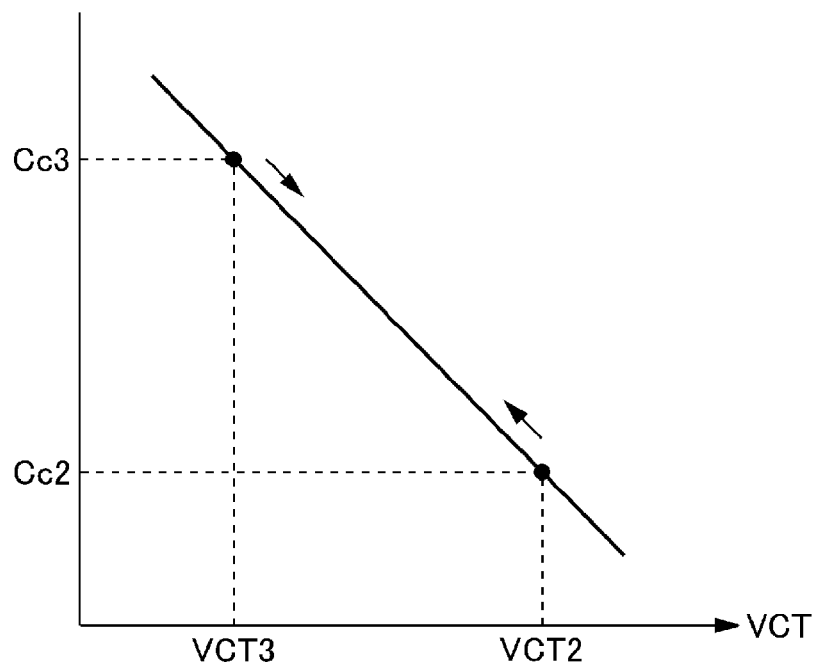
FIG. 14 is a graph illustrating the relationship between the electrostatic capacitances of the variable capacitors Cv2 and Cv3 and control voltage.

FIG. 14 is a graph illustrating the relationship between the electrostatic capacitances of the variable capacitors Cv2 and Cv3 and control voltage. When the control voltage VCT2 is reduced, the electrostatic capacitance Cc2 of the variable capacitor Cv2 increases. Since [VCT2+VCT3] is constant, the control voltage VCT3 increases, while the electrostatic capacitance Cc3 of the variable capacitor Cv3 is reduced. As described above, the Cc2 and Cc3 are adjusted while maintaining the relationship "Cc2+Cc3 is constant". In order to adjust the Cc2 and Cc3 while maintaining the relationship "Cc2+Cc3 is constant", it is preferable that the electrostatic capacitances of the capacitors Cc2 and Cc3 linearly change with respect to the control voltages VCT2 and VCT3. When the control voltage VCT2 increases, the electrostatic capacitance Cc2 is reduced, while the electrostatic capacitance Cc3 increases.

Figure 15:
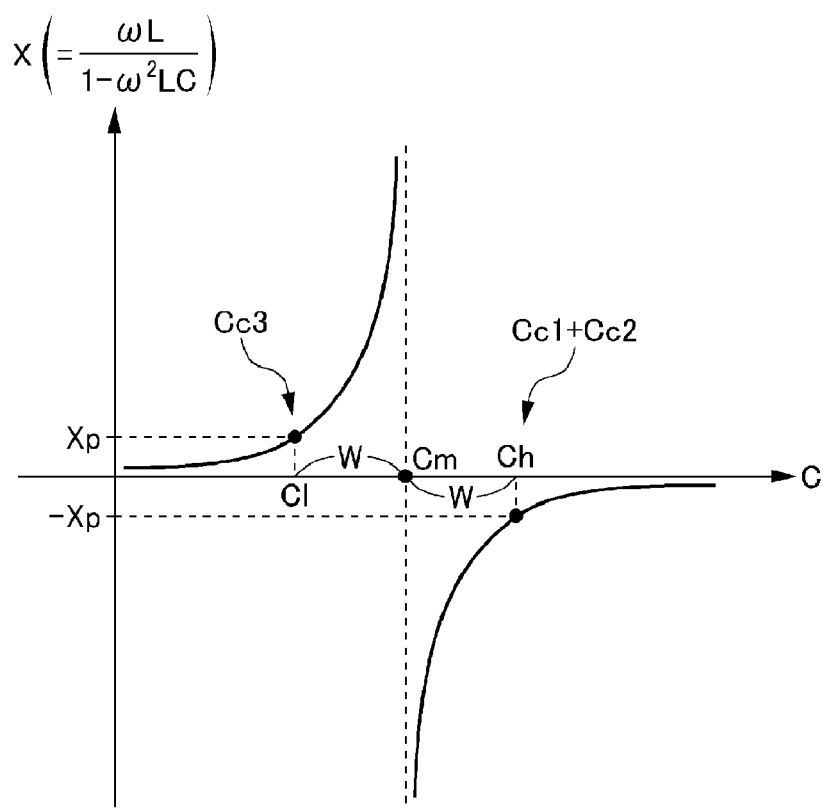
FIG. 15 is a graph illustrating the relationship between the electrostatic capacitance and reactance in a typical LC parallel circuit.

FIG. 15 is a graph illustrating the relationship between the electrostatic capacitance and reactance in a typical LC parallel circuit. A reactance X of an LC circuit in which a coil and a capacitor are connected in parallel is represented as X=ω·L/

$(1-\omega^2 LC)$. In this equation, $\omega$ is $2\pi \times$frequency, L is inductance, and C is electrostatic capacitance. The graph of FIG. 15 is point symmetric with respect to a predetermined electrostatic capacitance Cm.

The electrostatic capacitance of the second LC circuit 128 is represented as [Cc1+Cc2], and electrostatic capacitance of the first LC circuit 126 is Cc3. In FIG. 12, when the inductance of the inductor L8 of the first LC circuit 126 and inductance of the inductor L7 of the second LC circuit 128 are made equal to each other and, further, the inductance of the inductor L6 of the first LC circuit 126 and inductance of the inductor L9 of the second LC circuit 128 are set to zero, the first and second LC circuits 126 and 128 are LC parallel circuits in which only the electrostatic capacitances of the capacitors differ from each other. Thus, when Cc3=C1 (=Cm−W) is satisfied, X1=Xp is satisfied and when Cc1+Cc2=Ch (=Cm+W), X2=−Xp is satisfied, the reactance component X1 of the first LC circuit 126 cancels the reactance component X2 of the second LC circuit 128.

In the first-stage adjustment, Cc1 is adjusted with Cc2 and Cc3 fixed to remove the reactance component of the input impedance Z. In the second-stage adjustment, Cc2 and Cc3 are adjusted while maintaining a state where X1 and X2 cancel each other to adjust the real number part of the impedance Z, whereby the receiving power is maximized. Assume that Cm, Cc2, and Cc3 are initially set to 8.5 pF, 13 pF, and 3.5 pF, respectively. When 8.5+5.0=(Cc1+13) is solved (since W=5.0 (=8.5−3.5)), 0.5 pF is obtained as Cc1. That is, in the case where Cc2 and Cc3 are initially set to the above values, when Cc1 is set to 0.5 pF, the reactance of the input impedance Z can be removed. In the actual operation, Cc1 that can remove the reactance component of the impedance Z is searched for in consideration of the reactance component XL contained in the impedance ZL. Although the details will be described later, it is not difficult to search for the optimum value of such Cc1. In the case where the inductance of the inductor L6 of the first LC circuit 126 or inductance of the indictor L9 of the second LC circuit 128 is not zero, the reactance component of the impedance Z cannot completely be removed; however, the receiving power can be maximized since the reactance X1 and reactance X2 substantially cancel each other.

After Cc1 has been fixed, Cc2 and Cc3 are adjusted by the control voltage VCT2 of the subtractor 112 while maintaining the relationship "Cc2+Cc3 is constant" (in the above case, 3.5+13=16.5 pF). At this time, the receiving power can be adjusted while maintaining a state where the reactance component has been removed by the adjustment of Cc1. This is the second-stage adjustment.

Figure 16:
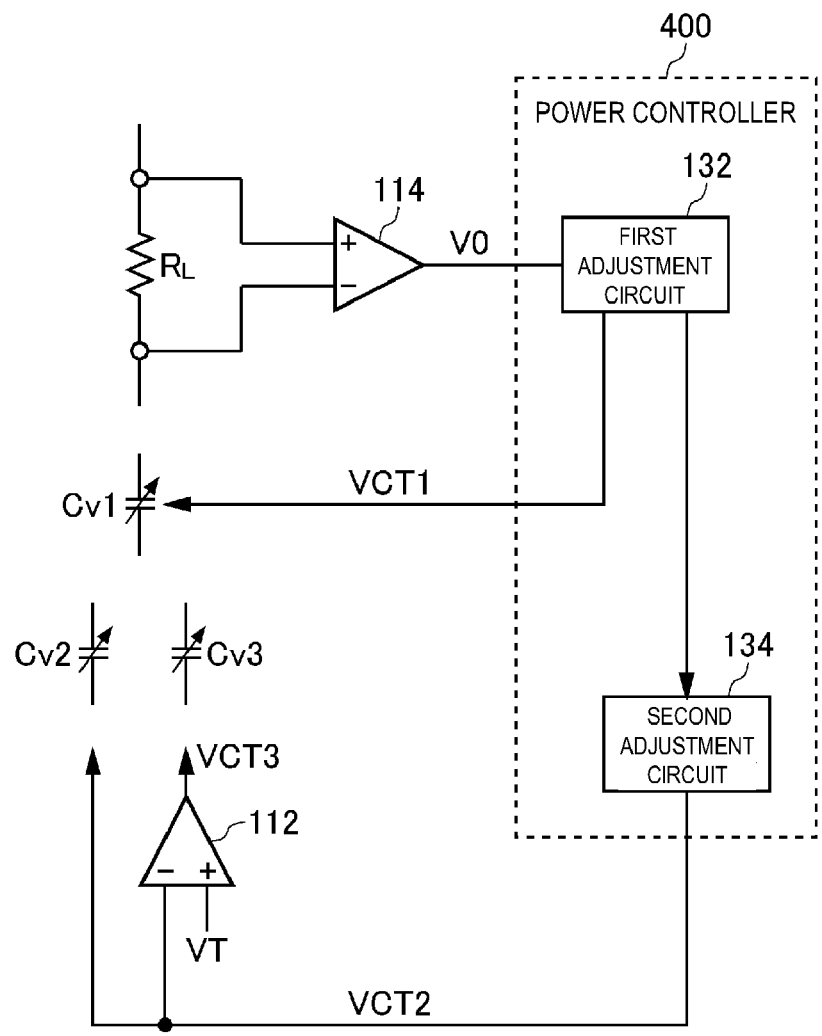
FIG. 16 is a circuit diagram of a connecting portion between the power controller and loading circuit in the second embodiment.

FIG. 16 is a circuit diagram of a connecting portion between the power controller 400 and loading circuit 140 in the second embodiment. The power controller 400 according to the second embodiment includes a first adjustment circuit 132 and a second adjustment circuit 134. The first adjustment circuit 132 executes the first-stage adjustment, and second adjustment circuit 134 executes the second-stage adjustment. The object of the adjustment in the second embodiment is to measure voltage (output voltage) applied to the resistance RL and to maximize it. The receiving power of the resistance RL may be measured according to the same method as that employed in the first embodiment. The receiving power is obtained by dividing the square of the output voltage by the resistance RL and thus there is a correlation between the receiving power and output voltage, so that the output voltage is set as a measurement target in the second embodiment.

The first adjustment circuit 132 measures a voltage signal V0 output from a subtraction amplifier 114. The first adjustment circuit 132 measures the voltage signal V0 and adjusts the variable capacitor Cv1 based on control voltage VCT1. In the first-stage adjustment, the electrostatic capacitances Cc2 and Cc3 of the variable capacitors Cv2 and Cv3 are fixed to the initial values. The first adjustment circuit 132 fixes the electrostatic capacitance Cc1 when the voltage signal V0 becomes a maximum value. At this time, the reactance of the first LC circuit 126 is canceled by the reactance of the second LC circuit 128. Thus, the first-stage adjustment is completed.

After completion of the first-stage adjustment, the second adjustment circuit 134 is activated. The second adjustment circuit 134 adjusts the variable capacitors Cv2 and Cv3 based on a control voltage VCT2. The adjustment of the variable capacitors Cv2 and Cv3 allows further increase in the voltage signal V0 even after maximizing the voltage signal V0 by the adjustment of the variable capacitor Cv1. The electrostatic capacitances Cc2 and Cc3 are fixed when the voltage signal V0 becomes a maximum value. The second adjustment circuit 134 adjusts the variable capacitors Cv2 and Cv3 using the subtractor 112 of FIG. 13 while maintaining the relationship "CC2+Cc3 is constant", in other words, while maintaining a state where the reactance of the first LC circuit 126 and reactance of the second LC circuit 128 cancel each other.

Figure 17:
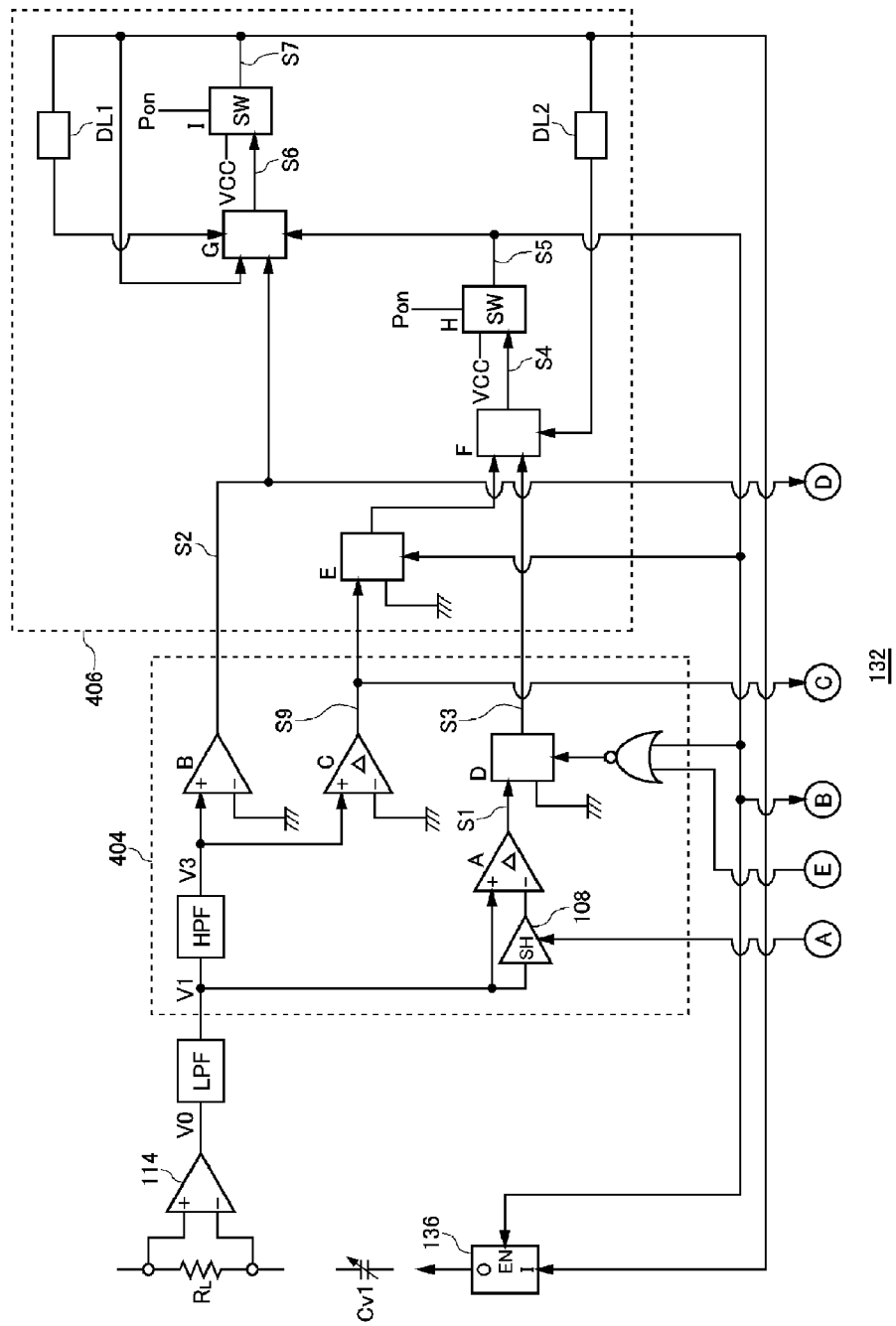
FIG. 17 is a circuit diagram of a first adjustment circuit.

FIG. 17 is a circuit diagram of the first adjustment circuit 132. As described above, as the first-stage adjustment, the first adjustment circuit 132 adjusts the variable capacitor Cv1. The electrostatic capacitances of the variable capacitors Cv2 and Cv3 are fixed to the initial values. The voltage signal V0 output from the subtraction amplifier 114 is subjected to signal component removal by a low-pass filter LPF and is then input to a slope detection circuit (e.g., a high-pass filter (HPF)) of the measurement unit 404 and comparator A as the voltage signal V1. The circuit configuration of the first adjustment circuit 132 is basically the same as that of the power controller 400 in the first embodiment.

The sample-hold circuit 108 holds the voltage signal V1 corresponding to the maximum value of the receiving power. Like the load control circuit 106 of FIG. 9, an electrostatic capacitance control circuit 136 generates control voltage of the capacitor Cv1 from the control signal S7 and holds control voltage corresponding to the maximum value of the receiving power. The control voltage generated from the control signal S7 is a signal for designating the electrostatic capacitance Cc1 of the variable capacitor Cv1.

When the voltage signal V1 becomes lower, the comparator A reacts. The switch circuit D activates the signal S3 to a high level, load resistance hold signal generation circuit F activates the signal S4 to a high level, and switch circuit H activates the control signal S5 to a high level. The activation of the control signal S5 activates the inactivated switch circuit E to thereby make the adjustment function effective. The activation of the control signal S5 inactivates the switch circuit D, disabling the comparator A once. Further, the activation of the control signal S5 activates the electrostatic capacitance control circuit 136. When being activated, the electrostatic capacitance control circuit 136 adjusts the electrostatic capacitance Cc1 according to electrostatic capacitance control voltage generated from the signal S7.

When the control signal S5 is activated, the load resistance control command signal generation circuit G activates the signal S6, and the switch circuit I activates the signal S7 to a high level. When the signal S7 is activated to a high level, the electrostatic capacitance control circuit 136 increases the electrostatic capacitance Cc1. The electrostatic capacitance Cc1 may be increased or decreased in the initial stage. In the present embodiment, the electrostatic capacitance Cc1 is increased in the first place.

In the case where the voltage signal V0 increases with the increase in the electrostatic capacitance Cc1, the electrostatic capacitance Cc1 continues to be increased. In the case where the voltage signal V0 decreases, the electrostatic capacitance Cc1 is reduced. In either case, when the voltage signal V0 becomes close to the maximum value, the comparator C reacts to inactivate the output of the switch circuit E to a low level. The signal S5 of the switch circuit H is inactivated to a low level, switch circuit E is inactivated, and adjustment unit 406 is inactivated. Even after the signal S5 has been inactivated to a low level, the switch circuit D is not inactivated at this time point since the input value from the end point E is a high level as described later. Further, the voltage signal V1 corresponding to a new maximum value has not been held at this time point by the sample-hold circuit 108 as described later. The electrostatic capacitance control circuit 136 is inactivated, and the adjustment of the electrostatic capacitance Cc1 is ended.

When the reactance component of the impedance Z is zero, the receiving power in the load LD becomes maximum. In other words, when the electrostatic capacitances Cc2 and Cc3 are given, the electrostatic capacitance Cc1 when the voltage signal V0 becomes maximum makes the reactance component of the impedance Z be zero. The first-stage adjustment aims to search for the electrostatic capacitance Cc1 when the reactance component of first LC circuit 126 cancels the reactance component of the second LC circuit 128.

Figure 18:
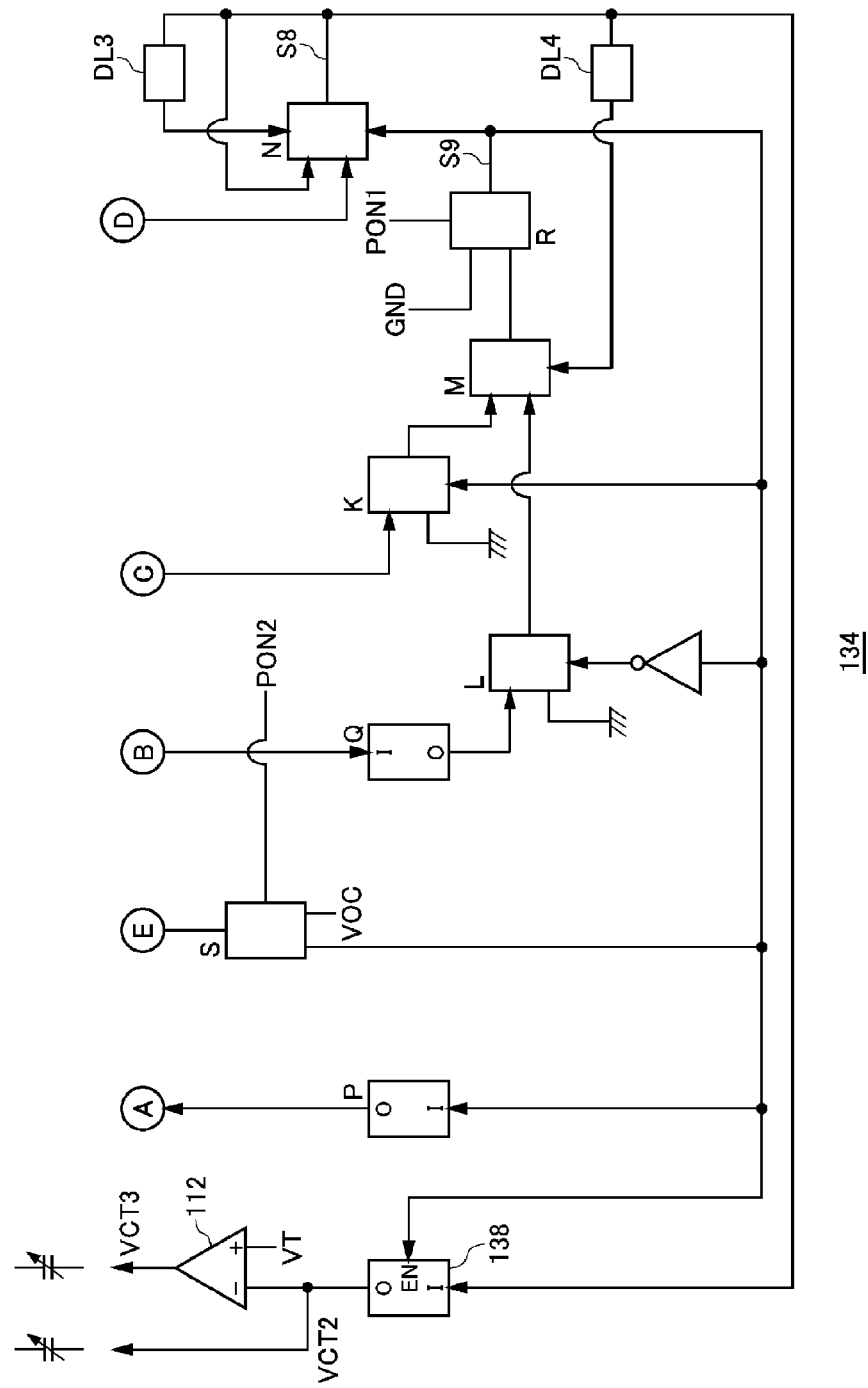
FIG. 18 is a circuit diagram of a second adjustment circuit.

FIG. 18 is a circuit diagram of the second adjustment circuit 134. When the voltage signal V0 becomes close to the maximum value in association with the adjustment of the electrostatic capacitance Cc1, the switch circuit H of the first adjustment circuit 132 is inactivated to a low level, and a second adjustment start-up circuit Q is temporarily activated to a high level. A switch circuit P and second adjustment start-up circuit Q generate an output signal that assumes a high level for a moment at the falling edge of the input signal and returns to a low level afterward. At the rising edge of the output signal of the second adjustment start-up circuit Q, the value of PON1 of the switch circuit R is made to assume a low level, and the output of the switch circuit R is switched from the ground potential to the output of a switch circuit M. Further, a switch circuit S maintains the potential of the end point E at a high level until the signal S9 assumes a low level to end the second adjustment. PON2 of the switch circuit S is a signal that assumes a low level when PON1 assumes a low level. After completion of the second adjustment, the switch circuit D of FIG. 17 is activated. That is, the second adjustment start-up circuit Q reacts in the wake of completion of the first adjustment, followed by successive reactions of a switch circuit L, an electrostatic capacitance hold signal generation circuit M, and a load resistance control command signal generation circuit N, with result that the load resistance control command signal generation circuit N activates a signal S8 to a high level. The activation of the control signal S9 output from the electrostatic capacitance hold signal generation circuit M activates an electrostatic capacitance control circuit 138.

When the signal S8 assumes a high level, the electrostatic capacitance control circuit 138 increases the control voltage VCT2 which is the output of the electrostatic capacitance control circuit 138 itself. As a result, according to the relationship illustrated in FIG. 14, the electrostatic capacitances Cc2 and Cc3 of the variable capacitors Cv2 and Cv3 decreases and increases, respectively.

Whether the voltage signal V0 is increasing or decreasing is checked by the comparator B. When the voltage signal V0 is increasing, the load resistance control command signal generation circuit N maintains the signal S8 at a high level. When the voltage signal V0 is decreasing, the load resistance control command signal generation circuit N inverts the signal S8. As a result, the electrostatic capacitance control circuit 138 reduces the control voltage VCT2. Invalidation circuits DL3 and DL4 have the same functions as those of the invalidation circuits DL1 and DL2 in the power controller 400 of the first embodiment and the first adjustment circuit 132 of the second embodiment and are provided for timing adjustment so as to prevent the signals S8 and S9 from being unintentionally inverted in association with the inversion of the signal S8.

When the voltage signal V0 becomes close to the maximum value, the comparator C reacts. Switch circuits K and M are inactivated, so that the signal S9 is inactivated, and the electrostatic capacitance control circuit 138 holds the S8 signal at that time. In this way, the values of the variable capacitors Cv2 and Cv3 are fixed.

The reactance component of the impedance Z has already been removed in the first stage. In the second stage, the variable capacitors Cv2 and Cv3 are controlled in conjunction with each other, so that a state where the reactance component has been removed is maintained. Under the assumption that the reactance component has been removed, the electrostatic capacitances Cc2 and Cc3 at the time when the voltage signal V0 becomes the maximum value can be searched for by the adjustment of the variable capacitors Cv2 and Cv3.

Third Embodiment

Figure 19:
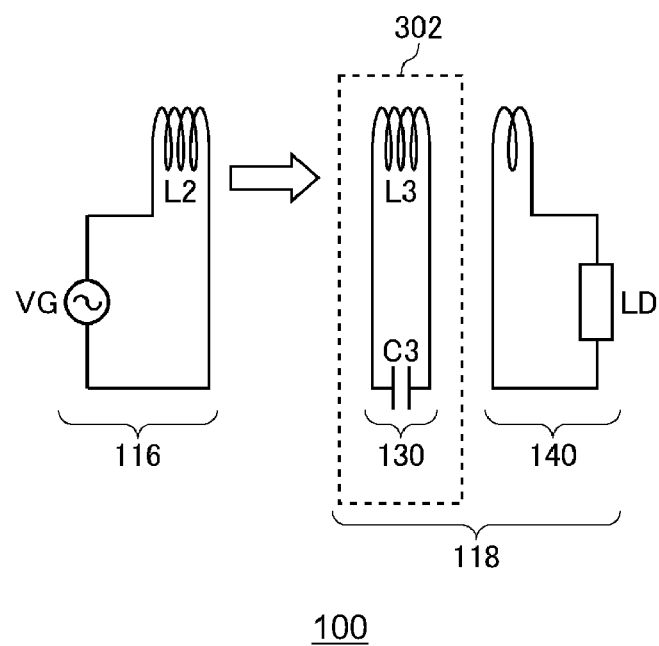
FIG. 19 is a view illustrating operation principle of the wireless power transmission system according to a third embodiment.

FIG. 19 is a view illustrating operation principle of the wireless power transmission system 100 according to a third embodiment. The wireless power transmission system 100 according to the third embodiment includes the wireless power feeder 116 and wireless power receiver 118. However, although the wireless power receiver 118 includes the power receiving LC resonance circuit 302, the wireless power feeder 116 does not include the power feeding LC resonance circuit 300. That is, the feeding coil L2 does not constitute a part of the LC resonance circuit. More specifically, the feeding coil L2 does not form any resonance circuit with other circuit elements included in the wireless power feeder 116. No capacitor is connected in series or in parallel to the feeding coil L2. Thus, the feeding coil L2 does not resonate in a frequency at which power transmission is performed.

The power feeding source VG supplies AC current of the resonance frequency fr1 to the feeding coil L2. The feeding coil L2 does not resonate but generates an AC magnetic field of the resonance frequency fr1. The receiving LC resonance circuit 302 resonates by receiving the AC magnetic field. As a result, large AC current flows in the power receiving LC resonance circuit 302. Studies have revealed that formation of the LC resonance circuit is not essential in the wireless power feeder 116. The feeding coil L2 does not constitute a part of the power feeding LC resonance circuit, so that the wireless power feeder 116 does not resonate at the resonance frequency fr1. It has been generally believed that, in the wireless power feeding of a magnetic field resonance type, making resonance circuits which are formed on both the power feeding side and power receiving side resonate at the same resonance frequency fr1 (=fr0) allows power feeding of large power. However, it is found that even in the case where the wireless power feeder 116 does not contain the power feeding LC resonance circuit 300, if the wireless power receiver 118 includes the power receiving LC resonance circuit 302, the wireless power feeding of a magnetic field resonance type can be achieved.

Even when the feeding coil L2 and receiving coil L3 are magnetic-field-coupled to each other, a new resonance circuit (new resonance circuit formed by coupling of resonance circuits) is not formed due to absence of the capacitor C2. In this case, the stronger the magnetic field coupling between the feeding coil L2 and receiving coil L3, the greater the influence exerted on the resonance frequency of the power receiving LC resonance circuit 302. By supplying AC current of this resonance frequency, that is, a frequency near the resonance frequency fr1 to the feeding coil L2, the wireless power feeding of a magnetic field resonance type can be achieved. In this configuration, the capacitor C2 need not be provided, which is advantageous in terms of size and cost.

Figure 20:
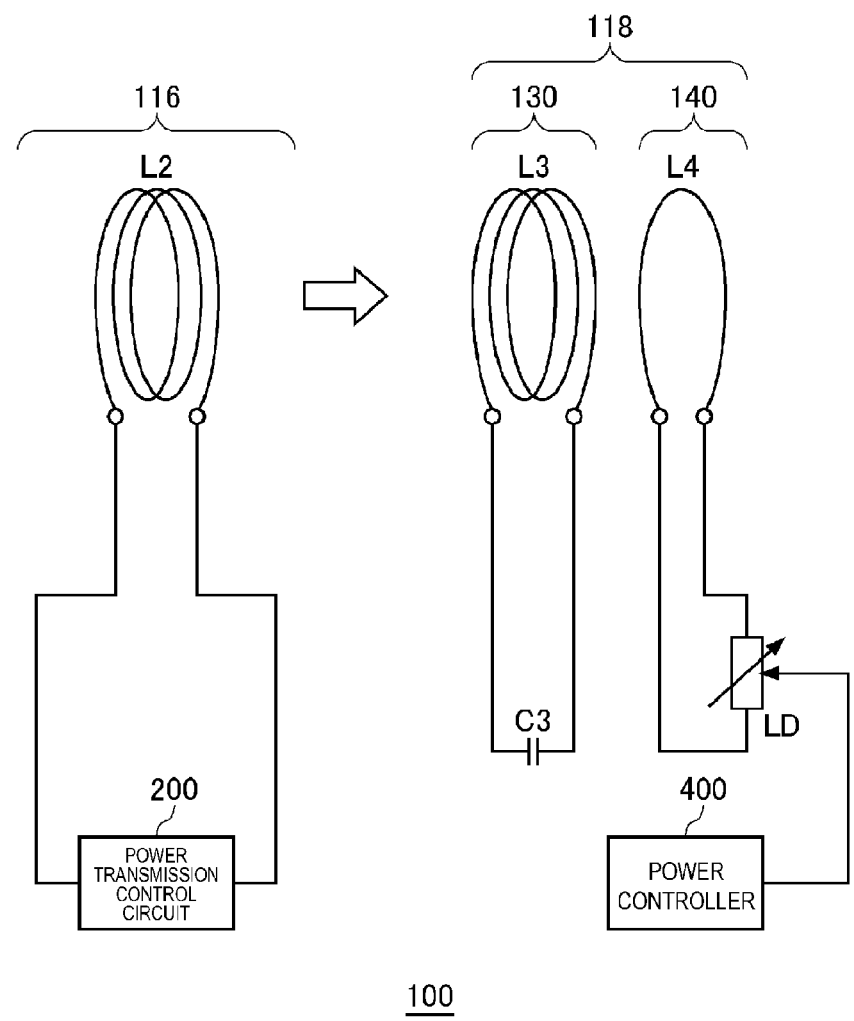
FIG. 20 is a system configuration view of the wireless power transmission system according to the third embodiment.

FIG. 20 is a system configuration view of the wireless power transmission system 100 according to the third embodiment. In the wireless power transmission system 100 illustrated in FIG. 20, the capacitor C2 is omitted. The other configurations are the same as those of the wireless power transmission system 100 of the first and second embodiments illustrated in FIG. 2.

The wireless power transmission system 100 has been described based on the above embodiments. In the first embodiment, the resistance component RL is adjusted for the purpose of bringing the receiving power close to its maximum value. In the second embodiment, the imaginary number part X and real number part R of the impedance Z are adjusted while making the reactances X1 and X2 to cancel each other for the same goal. In either case, the impedance Z is adjusted while actually measuring the receiving power or output voltage to thereby maximize the receiving power.

The adjustment of the resistance component RL and adjustment of the imaginary number part X and real number part R of the impedance Z may be performed in combination. Further, the power transmission control circuit 200 may make the drive frequency fo to track the resonance frequency fr1. For example, when the receiving power cannot be maintained after the drive frequency fo is made to track the resonance frequency fr1, the imaginary number part X and real number part R of the impedance Z may be adjusted. Further, when the receiving power cannot be compensated for despite the adjustment of the imaginary number part X and real number part R of the impedance Z, the resistance component RL as a load resistance may be adjusted.

The present invention has been described based on the above embodiments. It should be understood by those skilled in the art that the above embodiments are merely exemplary of the invention, various modifications and changes may be made within the scope of the claims of the present invention, and all such variations may be included within the scope of the claims of the present invention. Thus, the descriptions and drawings in this specification should be considered as not restrictive but illustrative.

For example, in the second embodiment, the second LC circuit 128 in which the inductor L7 is parallel-connected to a series connected circuit of the inductor L9 and variable capacitors (Cv1+Cv2) and first LC circuit 126 in which the inductor L8 parallel-connected to a series connected circuit of the inductor L6 and variable capacitor Cv3 are used. Alternatively, however, the second LC circuit 128 in which the variable capacitors (Cv1+Cv2) are parallel-connected to a series connected circuit of the inductors L9 and L7 and first LC circuit 126 in which the variable capacitor Cv3 is parallel-connected to a series connected circuit of the inductors L6 and L8 may be used. Also in this case, the imaginary number part of the impedance can be made zero. However, the resistance of the impedance Z cannot be adjusted to a value smaller than the value of the load resistance RL, this configuration is preferably used in the case where the value of the load resistance RL is small.

The "AC power" used in the wireless power transmission system 100 may be transmitted not only as an energy but also as a signal. Even in the case where an analog signal or digital signal is fed by wireless, the wireless power feeding method of the present invention may be used.

What is claimed is:

1. A wireless power receiver that receives, at a receiving coil, AC power wirelessly fed from a feeding coil using a magnetic field resonance phenomenon between the feeding coil and the receiving coil, the wireless power receiver comprising:
    the receiving coil;
    a loading circuit including a load that receives the AC power supplied from the receiving coil; and
    a power controller that controls the receiving power of the load, the power controller including:
        a measurement unit that measures the receiving power; and
        an adjustment unit that brings the receiving power close to its maximum value by changing a real number part of impedance of the loading circuit without substantially changing an imaginary part of the impedance of the loading circuit, wherein:
    the loading circuit includes first and second LC circuits,
    the adjustment unit performs first-stage adjustment for making reactance components of the first and second LC circuits to cancel each other and second-stage adjustment for adjusting the impedance of the loading circuit so as to maximize the receiving power,
    in the first-stage adjustment, the adjustment unit adjusts a first variable capacitor included in the second LC circuit such that the reactance components of the first and second LC circuits cancel each other, and
    in the second-stage adjustment, the adjustment unit adjusts a second variable capacitor included in the second LC circuit and a third variable capacitor included in the first LC circuit.

2. The wireless power receiver according to claim 1, wherein
    the adjustment unit holds a target value of the receiving power, and
    the measurement unit activates the adjustment unit when the receiving power decreases or increases by a predetermined value or more from the target value.

3. The wireless power receiver according to claim 2, wherein
    the adjustment unit holds the maximum value of the receiving power as a target value for next adjustment.

4. The wireless power receiver according to claim 1, wherein
    when the receiving power has been maximized, the measurement unit inactivates the adjustment unit.

5. The wireless power receiver according to claim 1, wherein
    the adjustment unit changes a state of a resistance component of the impedance in one of increase and decrease directions,
    the measurement unit measures the increase/decrease in the receiving power occurring in association with the change in the state of the resistance component, and
    the adjustment unit maintains the increase/decrease direction of the resistance component when the receiving power increases, while inverts the increase/decrease direction when the receiving power decreases.

6. The wireless power receiver according to claim 1, wherein
the adjustment unit determines whether the receiving power comes close to its maximum value or not from a direction and a magnitude of a change in the receiving power occurring due to the change of the impedance of the loading circuit.

7. A wireless power transmission system for wirelessly feeding power from a feeding coil to a receiving coil using a magnetic field resonance phenomenon between the feeding coil and the receiving coil, the wireless power transmission system comprising:
a wireless power feeder; and
a wireless power receiver, wherein:
the wireless power feeder includes:
the feeding coil; and
a power transmission control circuit that supplies AC power to the feeding coil so as to make the feeding coil feed the AC power to the receiving coil,
the wireless power receiver includes:
the receiving coil;
a loading circuit including a loading coil that is magnetically coupled to the receiving coil to receive the AC power from the receiving coil and a load that receives the AC power supplied from the loading coil; and
a power controller that controls the receiving power of the load, the power controller including:
a measurement unit that measures the receiving power; and
an adjustment unit that maximizes the receiving power by changing a real number part of impedance of the loading circuit without substantially changing an imaginary part of the impedance of the loading circuit,
the loading circuit includes first and second LC circuits,
the adjustment unit performs first-stage adjustment for making reactance components of the first and second LC circuits to cancel each other and second-stage adjustment for adjusting the impedance of the loading circuit so as to maximize the receiving power,
in the first-stage adjustment, the adjustment unit adjusts a first variable capacitor included in the second LC circuit such that the reactance components of the first and second LC circuits cancel each other, and
in the second-stage adjustment, the adjustment unit adjusts a second variable capacitor included in the second LC circuit and a third variable capacitor included in the first LC circuit.

8. A power controller comprising:
a measurement unit that measures receiving wireless power of an electronic circuit including first and second LC circuits; and
an adjustment unit that maximizes the receiving wireless power by changing impedance of the electronic circuit, wherein
the adjustment unit adjusts a first variable capacitor included in the second LC circuit such that reactances of the first and second LC circuits cancel each other and then adjusts a second variable capacitor included in the second LC circuit and a third variable capacitor included in the first LC circuit.

* * * * *